(12) United States Patent
Sakai et al.

(10) Patent No.: US 11,557,493 B2
(45) Date of Patent: Jan. 17, 2023

(54) SUBSTRATE CLEANING APPARATUS AND SUBSTRATE CLEANING METHOD

(71) Applicant: Tokyo Electron Limited, Tokyo (JP)

(72) Inventors: Toshimitsu Sakai, Nirasaki (JP); Keiko Hada, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/951,318

(22) Filed: Nov. 18, 2020

(65) Prior Publication Data
US 2021/0159096 A1  May 27, 2021

(30) Foreign Application Priority Data

Nov. 25, 2019 (JP) .............................. JP2019-212110

(51) Int. Cl.
*H01L 21/02* (2006.01)
*H01L 21/67* (2006.01)
*B08B 3/00* (2006.01)

(52) U.S. Cl.
CPC .......... *H01L 21/67051* (2013.01); *B08B 3/00* (2013.01); *H01L 21/02057* (2013.01)

(58) Field of Classification Search
None
See application file for complete search history.

(56) References Cited

U.S. PATENT DOCUMENTS

| 5,235,995 | A | * | 8/1993 | Bergman | .......... | H01L 21/68728 134/182 |
| 6,328,809 | B1 | * | 12/2001 | Elsawy | ............. | H01L 21/67028 134/1 |
| 2018/0169712 | A1 | * | 6/2018 | Yasuda | ............. | H01L 21/67051 |
| 2020/0258748 | A1 | * | 8/2020 | Okada | ................. | C23C 16/0272 |

FOREIGN PATENT DOCUMENTS

| JP | 2002-355618 A | 12/2002 |
| JP | 2017-126734 A | 7/2017 |

* cited by examiner

*Primary Examiner* — Mikhail Kornakov
*Assistant Examiner* — Ryan L Coleman
(74) *Attorney, Agent, or Firm* — Nath, Goldberg & Meyer; Jerald L. Meyer; Tanya E. Harkins

(57) ABSTRACT

A substrate cleaning apparatus, includes a vaporizer configured to generate water vapor, a first heating part configured to heat a nitrogen gas to a first temperature, a second heating part configured to heat the nitrogen gas to a second temperature, wherein the second temperature is higher than the first temperature, and at least one cleaning chamber connected to the vaporizer, the first heating part, and the second heating part, wherein the at least one cleaning chamber is configured so that at least one substrate is exposed to the water vapor, the nitrogen gas having the first temperature, or the nitrogen gas having the second temperature under an atmospheric pressure.

2 Claims, 18 Drawing Sheets

SUBSTRATE CLEANING APPARATUS AND SUBSTRATE CLEANING METHOD

CROSS-REFERENCE TO RELATED APPLICATION

This application is based upon and claims the benefit of priority from Japanese Patent Application No. 2019-212110, filed on Nov. 25, 2019, the entire contents of which are incorporated herein by reference.

TECHNICAL FIELD

The present disclosure relates to a substrate cleaning apparatus and a substrate cleaning method.

BACKGROUND

Patent Document 1 discloses a substrate processing method including a first step of processing a substrate with a gas containing fluorine and a second step of exposing the substrate to an atmosphere containing moisture. In this substrate processing method, fluorine remaining on the surface of the substrate is removed by exposing the substrate to an atmosphere containing moisture.

PRIOR ART DOCUMENTS

Patent Documents

Patent Document 1: Japanese laid-open publication No. 2017-126734

SUMMARY

According to one embodiment of the present disclosure, there is provided a substrate cleaning apparatus, including a vaporizer configured to generate water vapor, a first heating part configured to heat a nitrogen gas to a first temperature, a second heating part configured to heat the nitrogen gas to a second temperature, wherein the second temperature is higher than the first temperature, and at least one cleaning chamber connected to the vaporizer, the first heating part, and the second heating part, wherein the at least one cleaning chamber is configured so that at least one substrate is exposed to the water vapor, the nitrogen gas having the first temperature, or the nitrogen gas having the second temperature under an atmospheric pressure.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
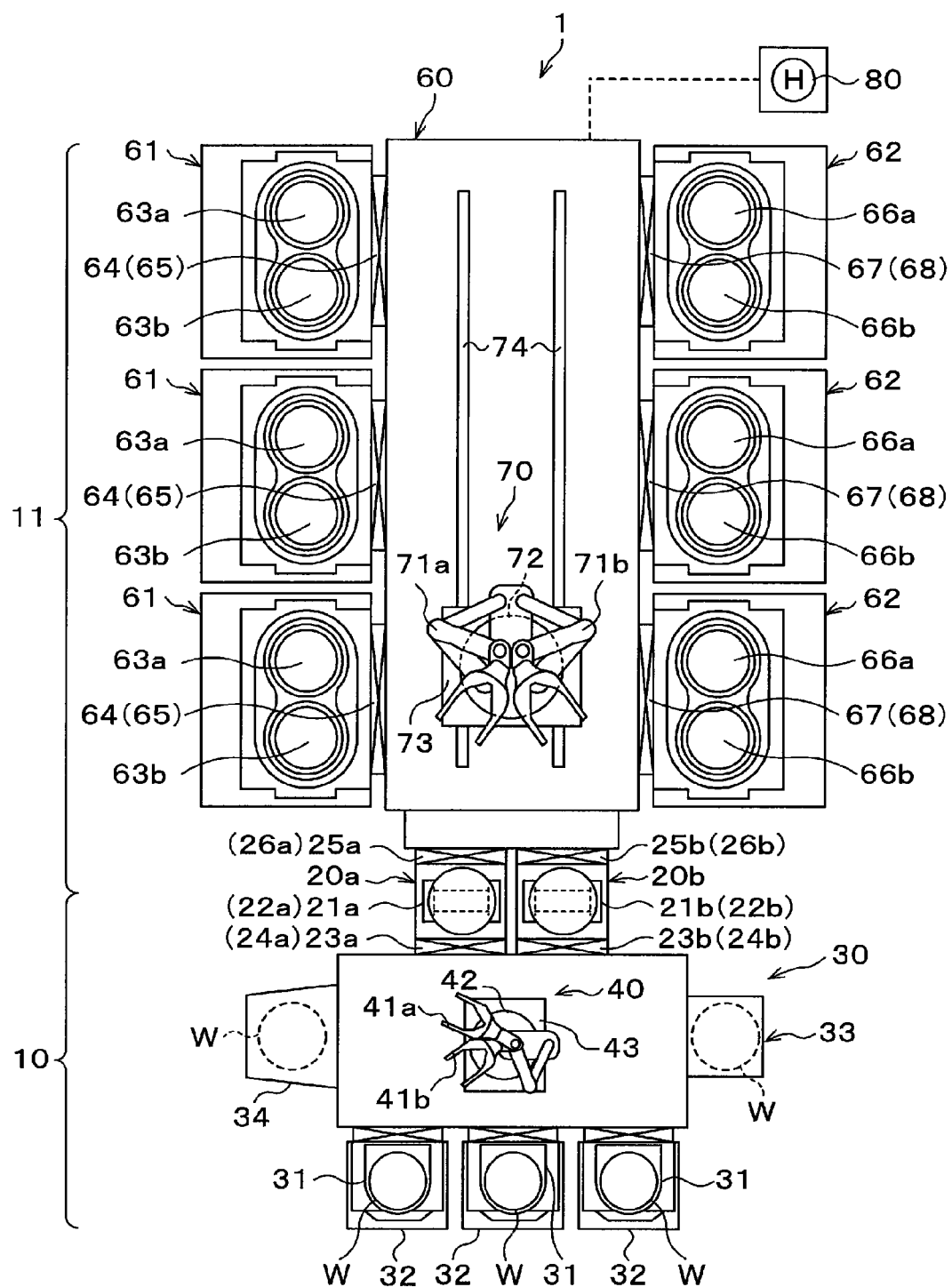
FIG. 1 is a plan view illustrating an outline of a configuration of a wafer processing apparatus according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In manufacturing processes of a semiconductor device, a process of etching and removing an oxide film formed on a surface of a semiconductor wafer (hereinafter, referred to as a "wafer") is carried out. For example, the process of etching an oxide film is carried out by a chemical oxide removal (COR) process and a post heat treatment (PHT) process.

In the COR process, a processing gas is supplied to the surface of the oxide film so that the oxide film and the processing gas are chemically reacted to change the oxide film so as to generate a reaction product. For example, a hydrogen fluoride gas and an ammonia gas are used for the processing gas, and ammonium fluorosilicate (AFS) is generated as the reaction product. In the PHT process, the AFS on a wafer is heated to a sublimation temperature or higher in a process chamber accommodating the wafer to be vaporized (sublimated). The etching of the oxide film is performed by continuously performing these COR process and PHT process.

However, fluorine may remain on the surface of the wafer after the COR process and the PHT process are performed. The residual fluorine may corrode a wiring film or the like formed on the surface of the wafer and deteriorate electrical characteristics of a semiconductor device manufactured from the wafer. Therefore, it is necessary to remove the fluorine remaining on the surface of the wafer.

Conventionally, as a method for removing fluorine, a method for performing wet cleaning using dilute hydrofluoric acid (DHF) or pure water (DIW) as a cleaning liquid on a wafer, a method for removing fluorine by plasma, or the like has been performed. However, in the method by wet cleaning, a fine pattern formed on the surface of the wafer may be collapsed due to the surface tension of the cleaning liquid. Further, in the method using plasma, since a mechanism for generating plasma is required and a decompression process for generating plasma is also required, throughput of wafer processing is reduced.

Therefore, in the method disclosed in Patent Document 1 described above, fluorine is removed by exposing the wafer to an atmosphere containing moisture. Specifically, after the wafer is loaded into a process chamber, water vapor is supplied from a moisture supply mechanism to the process chamber to expose the surface of the wafer in the process chamber to an atmosphere adjusted to a desired humidity. After the lapse of a desired time, the wafer is unloaded from the process chamber.

In such a case, since the wafer is unloaded in a state in which it is exposed to a high humidity atmosphere is unloaded, moisture may remain on the surface of the wafer during the unloading. If the wafer with moisture remaining in this way is transferred, a wafer transfer device or a wafer accommodation vessel may get wet. However, Patent Document 1 does not disclose how to process the wafer after removing fluorine. Therefore, there is a room for improvement in the conventional cleaning process.

A technique according to the present disclosure appropriately removes fluorine remaining on the surface of the wafer. Hereinafter, a wafer processing apparatus and a wafer processing method according to an embodiment of the present disclosure will be described with reference to the drawings. Further, in the present disclosure and the drawings, elements having substantially like functional configurations are denoted by like reference numerals and a repeated description thereof will be omitted.

<Wafer Processing Apparatus>

First, a configuration of the wafer processing apparatus according to the present embodiment will be described. FIG. 1 is a plan view illustrating an outline of a configuration of a wafer processing apparatus according to the present embodiment. In the present embodiment, a case where a wafer processing apparatus 1 includes various processing modules for performing a COR process, a PHT process, a cleaning process, and an orienting process on wafers W as substrates will be described. The module configuration of the wafer processing apparatus 1 of the present disclosure is not limited thereto but may be arbitrarily selected.

As illustrated in FIG. 1, the wafer processing apparatus 1 has a configuration in which an atmospheric part 10 and a decompression part 11 are integrally connected via load lock modules 20a and 20b. The atmospheric part 10 includes a plurality of atmospheric modules that performs a desired process on the wafers W in an atmospheric pressure atmosphere. The decompression part 11 includes a plurality of decompression modules that performs a desired process on the wafers W in a decompressed atmosphere.

The load lock module 20a temporarily holds the wafers W in order to deliver the wafers W transferred from a loader module 30 as described later in the atmospheric part 10 to a transfer module 60 described later in the decompression part 11. The load lock module 20a has an upper stocker 21a and a lower stocker 22a that hold two wafers W along a vertical direction.

The load lock module 20a is connected to the loader module 30 as described later via a gate 24a having a gate valve 23a. By the gate valve 23a, airtightness between the load lock module 20a and the loader module 30 is ensured and communication with each other is possible. Furthermore, the load lock module 20a is connected to the transfer module 60 as described later via a gate 26a having a gate valve 25a. By the gate valve 25a, airtightness between the load lock module 20a and the transfer module 60 is ensured and communication with each other is possible.

An air supply part (not shown) for supplying a gas and an exhaust part (not shown) for discharging the gas are connected to the load lock module 20a, and it is configured so that the inside of the load lock module 20a is switchable between an atmospheric pressure atmosphere and a decompressed atmosphere by the air supply part and the exhaust part. That is, the load lock module 20a is configured so that the wafers W can be appropriately transferred between the atmospheric part 10 in an atmospheric pressure atmosphere and the decompression part 11 in a decompressed atmosphere.

Furthermore, the load lock module 20b has the same configuration as the load lock module 20a. That is, the load lock module 20b has an upper stocker 21b and a lower stocker 22b, a gate valve 23b and a gate 24b on the loader module 30 side, and a gate valve 25b and a gate 26b on the transfer module 60 side.

The numbers and arrangements of the load lock modules 20a and 20b are not limited to the present embodiment but may be arbitrarily set.

The atmospheric part 10 has the loader module 30 provided with a wafer transfer mechanism 40 as described later, load ports 32 on which FOUPs (Front Opening Unified Pod) 31 capable of storing a plurality of wafers W are placed, a wafer cleaning module 33 for removing fluorine from the wafers W, and an orienting module 34 for adjusting the orientation of the wafers W in the horizontal direction.

The loader module 30 has a rectangular housing therein, in which an inside of the housing is maintained in an atmospheric pressure atmosphere. A plurality of load ports, for example, three load ports 32, are arranged side by side on one side surface forming a long side of the housing of the loader module 30. The load lock modules 20a and 20b are arranged side by side on the other side surface forming the long side of the housing of the loader module 30. The wafer cleaning module 33 is installed on one side surface forming a short side of the housing of the loader module 30. The orienting module 34 is installed on the other side surface forming the short side of the housing of the loader module 30.

The numbers and arrangements of the load ports 32, the wafer cleaning module 33, and the orienting module 34 are not limited to the present embodiment but maybe arbitrarily designed. For example, a plurality of wafer cleaning modules 33 may be installed and may be installed on both sides of the load lock modules 20a and 20b. Furthermore, for example, the wafer cleaning module 33 may be installed stand-alone in the wafer processing apparatus 1.

The FOUP 31 accommodates the plurality of wafers W, for example, 25 wafers of one lot, at equal intervals and in multiple stages. Furthermore, an inside of the FOUP 31 placed on the load ports 32 is filled with, for example, air or a nitrogen gas, to be sealed.

The wafer cleaning module 33 cleans the surface of the wafer W by removing fluorine remaining on the surface of the wafer W after the COR process and the PHT process are performed. A specific configuration of the wafer cleaning module 33 will be described later.

The orienting module 34 adjusts the orientation of the wafer W in the horizontal direction by rotating the wafer W. Specifically, in the orienting module 34, orientation of each of the wafers W from a reference position (for example, a notch position) in the horizontal direction is adjusted to be equal to each other in processing a plurality of wafers W.

The wafer transfer mechanism 40 for transferring the wafers W is installed inside the loader module 30. The wafer transfer mechanism 40 has transfer arms 41a and 41b that hold and move the wafers W, a turntable 42 that rotatably supports the transfer arms 41a and 41b, and a rotary mounting table 43 on which the turntable 42 is mounted. The wafer transfer mechanism 40 is configured to be movable in a longitudinal direction inside the housing of the loader module 30.

The decompression part 11 has the transfer module 60 that simultaneously transfers two wafers W, a COR module 61 that performs the COR process on the wafers W transferred from the transfer module 60, and a PHT module 62 that performs the PHT process. The insides of the transfer module 60, the COR module 61, and the PHT module 62 are each maintained in a decompressed atmosphere. For the transfer module 60, a plurality of COR modules 61 and PHT modules 62 are installed, for example, three by three.

The transfer module 60 has a rectangular housing therein and is connected to the load lock modules 20a and 20b via the gate valves 25a and 25b described above. The transfer module 60 sequentially transfers the wafer W carried into the load lock module 20a to one COR module 61 and one PHT module 62 to perform the COR process and the PHT process, and then unloads the wafer W to the atmospheric part 10 via the load lock module 20b.

Two stages 63a and 63b on which two wafers W are placed side by side in the horizontal direction are installed inside the COR module 61. The COR module 61 simultaneously performs the COR process on two wafers W by placing the wafers W side by side on the stages 63a and 63b. In addition, an air supply part (not shown) for supplying a processing gas, a purge gas or the like, and an exhaust part (not shown) for discharging the gas are connected to the COR module 61.

Furthermore, the COR module 61 is connected to the transfer module 60 via a gate 65 having a gate valve 64. By the gate valve 64, airtightness between the transfer module 60 and the COR module 61 is ensured and communication with each other is possible.

Two stages 66a and 66b on which two wafers W are mounted side by side in the horizontal direction are installed inside the PHT module 62. The PHT module 62 simultaneously performs the PHT process on the two wafers W by mounting the wafers W side by side on the stages 66a and 66b. Also, an air supply part (not shown) for supplying a gas and an exhaust part (not shown) for discharging the gas are connected to the PHT module 62.

Furthermore, the PHT module 62 is connected to the transfer module 60 via a gate 68 having a gate valve 67. By the gate valve 67, airtightness between the transfer module 60 and the PHT module 62 is ensured and communication with each other is possible.

A wafer transfer mechanism 70 for transferring the wafers W is installed inside the transfer module 60. The wafer transfer mechanism 70 has transfer arms 71a and 71b that hold and move the two wafers W, a turntable 72 that rotatably supports the transfer arms 71a and 71b, and a rotary mounting table 73 that mounts the turntable 72. In addition, a guide rail 74 extending in the longitudinal direction of the transfer module 60 is installed inside the transfer module 60. The rotary mounting table 73 is installed on the guide rail 74, and is configured to move the wafer transfer mechanism 70 along the guide rail 74.

In the transfer module 60, the transfer arm 71a receives the two wafers W held by the upper stocker 21a and the lower stocker 22a in the load lock module 20a and transfers them to the COR module 61. Furthermore, the two wafers W after the COR process is performed are held by the transfer arm 71a and transferred to the PHT module 62. In addition, the two wafers W after the PHT process is performed are held by the transfer arm 71b and unloaded to the load lock module 20b.

A controller 80 is installed in the wafer processing apparatus 1 described above. The controller 80 is a computer including, for example, a CPU, a memory and the like, and has a program storage part (not shown). A program for controlling the processing of the wafers W in the wafer processing apparatus 1 is stored in the program storage part. Furthermore, a program for controlling the operations of various processing modules and a driving system such as the transfer mechanism, as described above, to realize wafer processing described later in the wafer processing apparatus 1 is also stored in the program storage part. The programs have been stored in a computer-readable storage medium H and may be installed in the controller 80 from the storage medium H.

<Operation of the Wafer Processing Apparatus>

The wafer processing apparatus 1 according to the present embodiment is configured as described above. Next, the wafer processing in the wafer processing apparatus 1 will be described.

First, the FOUPs 31 storing a plurality of wafers W are placed on the load ports 32. Furthermore, an oxide film has been formed on the surface of each of the wafers.

Next, two wafers W are taken out of the FOUP 31 by the wafer transfer mechanism 40 and transferred to the orienting module 34. In the orienting module 34, the orientation of the wafers W in the horizontal direction from the reference position (for example, the notch position) is adjusted (orienting process).

Next, the two wafers W are loaded into the load lock module 20a by the wafer transfer mechanism 40. When the two wafers W are loaded into the load lock module 20a, the gate valve 23a is closed, and the inside of the load lock module 20a is sealed and decompressed. Thereafter, the gate valve 25a is opened and the inside of the load lock module 20a and the inside of the transfer module 60 communicate with each other.

Next, when the load lock module 20a and the transfer module 60 communicate with each other, the two wafers W are held by the transfer arm 71a of the wafer transfer mechanism 70, and loaded into the transfer module 60 from the load lock module 20a. Subsequently, the wafer transfer mechanism 70 moves to the front of one COR module 61.

Next, the gate valve 64 is opened and the transfer arm 71a holding the two wafers W enters the COR module 61. Then, the two wafers W are placed on the stages 63a and 63b, respectively, from the transfer arm 71a. Thereafter, the transfer arm 71a exits from the COR module 61.

Next, when the transfer arm 71a exits from the COR module 61, the gate valve 64 is closed, and the COR process is performed on the two wafers W in the COR module 61. Then, the oxide film is changed to generate AFS, which is a reaction product.

Next, when the COR process in the COR module 61 is completed, the gate valve 64 is opened and the transfer arm 71a enters the COR module 61. Then, the two wafers W are delivered from the stages 63a and 63b to the transfer arm 71a, and the two wafers W are held by the transfer arm 71a. Thereafter, the transfer arm 71a exits from the COR module 61, and the gate valve 64 is closed.

Next, the wafer transfer mechanism 70 moves to the front of the PHT module 62. Subsequently, the gate valve 67 is opened and the transfer arm 71a holding the two wafers W enters the PHT module 62. Then, the two wafers W are placed on the stages 66a and 66b, respectively, from the transfer arm 71a. Thereafter, the transfer arm 71a exits from the PHT module 62. Subsequently, the gate valve 67 is closed and the PHT process is performed on the two wafers W. Then, AFS on the wafers W is sublimated.

Next, when the PHT process on the wafers W is completed, the gate valve 67 is opened and the transfer arm 71b enters the PHT module 62. Then, the two wafers W are delivered from the stages 66a and 66b to the transfer arm 71b and the two wafers W are held by the transfer arm 71b. Thereafter, the transfer arm 71b exits from the PHT module 62, and the gate valve 67 is closed.

Next, the gate valve 25b is opened and the two wafers W are loaded into the load lock module 20b by the wafer transfer mechanism 70. When the wafers W are loaded into the load lock module 20b, the gate valve 25b is closed to seal the inside of the load lock module 20b, and then the load lock module 20b is opened to an atmosphere.

Next, the two wafers W are transferred to the wafer cleaning module 33 by the wafer transfer mechanism 40. In the wafer cleaning module 33, fluorine remaining on the surfaces of the wafers W is removed, and the surfaces of the wafers W are cleaned. A specific process of this cleaning process will be described later.

Next, the two wafers W are returned to the FOUP 31 by the wafer transfer mechanism 40 to be accommodated. In this manner, the series of wafer processing in the wafer processing apparatus 1 is completed.

First Embodiment

Figure 2:
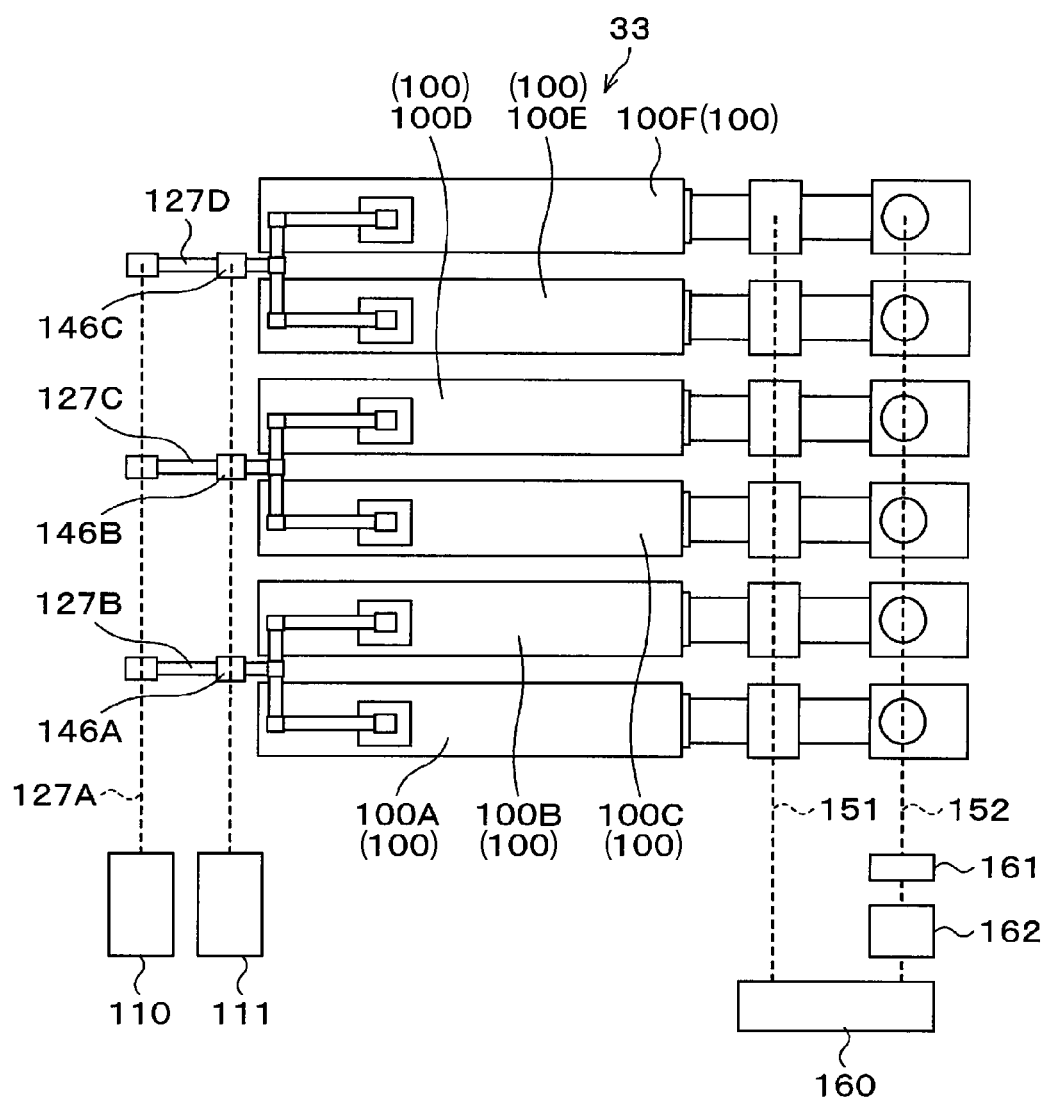
FIG. 2 is an explanatory view illustrating an outline of a configuration of a wafer cleaning module according to a first embodiment of the present disclosure.
Figure 3:
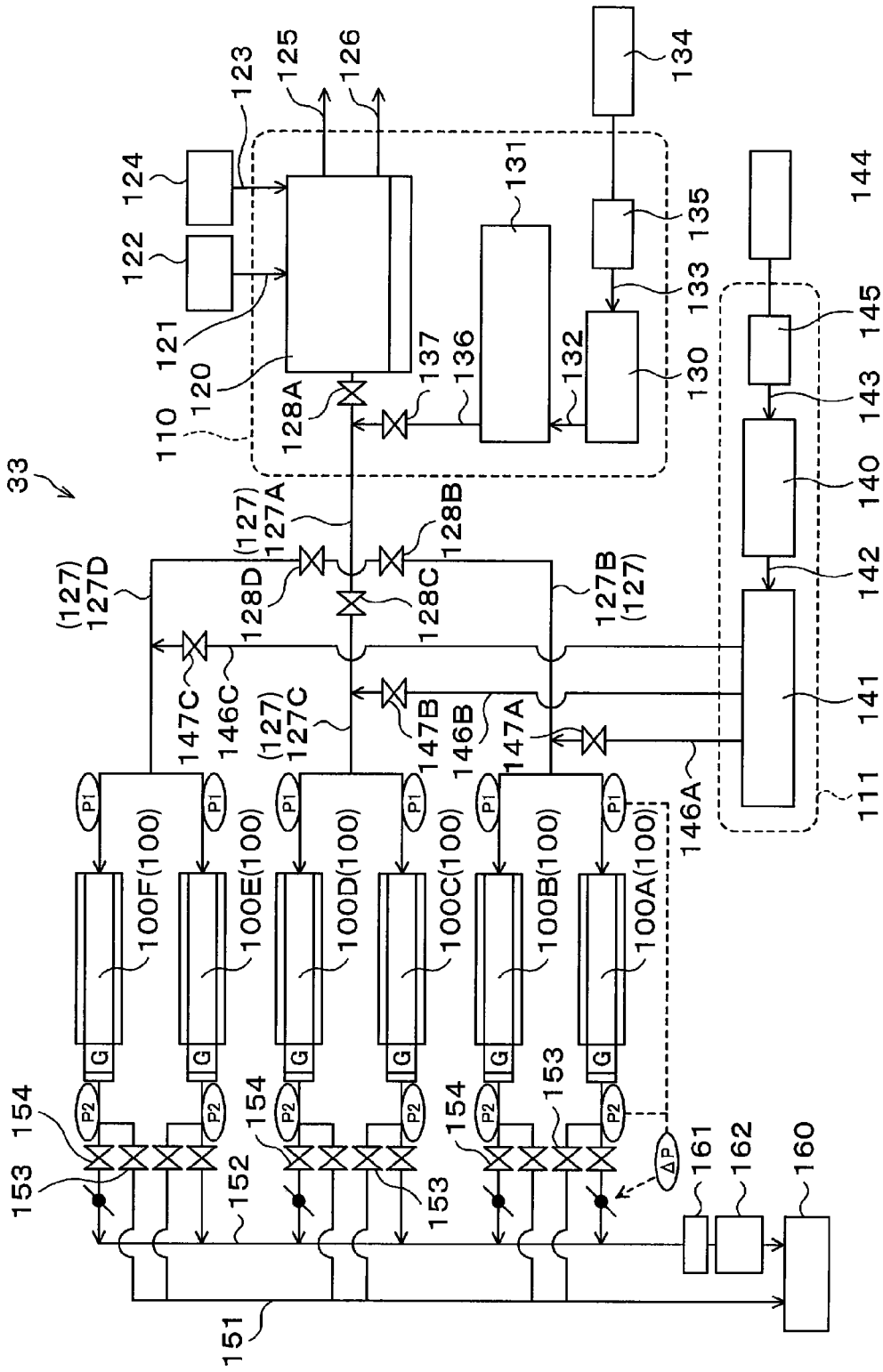
FIG. 3 is an explanatory view illustrating an outline of a configuration of the wafer cleaning module according to the first embodiment.

Next, a configuration of the wafer cleaning module 33 as the substrate cleaning apparatus according to a first embodiment of the present disclosure will be described. FIGS. 2 and 3 are explanatory views illustrating an outline of the configuration of the wafer cleaning module 33.

The wafer cleaning module 33 has a plurality of cleaning chambers 100 each of which accommodates one wafer W. A plurality of cleaning chambers, for example, six cleaning chambers 100, are installed to be vertically stacked on one side surface forming the short side of the housing of the loader module 30. In the following description, these six cleaning chambers 100 may be referred to as cleaning chambers 100A to 100F from the lower stage side to the upper stage side. The number of cleaning chambers 100 is not limited to the first embodiment but may be arbitrarily set. Furthermore, reference symbol "G" in FIG. 3 indicates a gate described later.

As described above, the two wafers W are transferred to the wafer cleaning module 33 to process the two sheets of wafers. Therefore, in the first embodiment, the two wafers W are processed using the two cleaning chambers 100. Specifically, the two wafers W are processed in each of a pair of cleaning chambers 100A and 100B, a pair of cleaning chambers 100C and 100D, and a pair of cleaning chambers 100E and 100F.

Two air supply modules 110 and 111 are connected to each of the six cleaning chambers 100A to 100F. The air supply module 110 supplies water vapor and a second nitrogen gas to the cleaning chamber 100. The air supply module 111 supplies a first nitrogen gas to the cleaning chamber 100. Furthermore, the air supply modules 110 and 111 supply the water vapor, the first nitrogen gas, and the second nitrogen gas to each of the pair of cleaning chambers 100.

The air supply module 110 has a vaporizer 120 as a vaporization part that generates water vapor and supplies it to the cleaning chamber 100. A pure water supply source 122 for storing pure water therein is connected to the vaporizer 120 via a supply line 121. In addition, a nitrogen gas supply source 124 for storing a nitrogen gas therein is connected to the vaporizer 120 via a supply line 123. In the vaporizer 120, the pure water supplied from the pure water supply source 122 is vaporized to generate the water vapor. Furthermore, the nitrogen gas supplied to the vaporizer 120 is used as, for example, a carrier gas when supplying the water vapor to the cleaning chamber 100.

A vent line 125 for exhausting an inside of the vaporizer 120 is connected to the vaporizer 120. In addition, a drain fan for discharging internal wastewater is installed at the bottom of the vaporizer 120, and a drain 126 is connected to the drain fan.

The cleaning chamber 100 and the vaporizer 120 are connected by a water vapor supply line 127. The water vapor supply line 127 has a collective line 127A connected to the vaporizer 120, and branch lines 127B to 127D branched from the collective line 127A and connected to the cleaning chambers 100A to 100F. The branch line 127B is connected to the cleaning chambers 100A and 100B, the branch line 127C is connected to the cleaning chambers 100C and 100D, and the branch line 127C is connected to the cleaning chambers 100E and 100F. In addition, valves 128A to 128D are installed in the collective line 127A and the branch lines 127B to 127D, respectively.

The air supply module 110 further has a second heating part 130 for heating the nitrogen gas to a second temperature, for example, 120 to 300 degrees C., more preferably 200 to 300 degrees C., and a pressurizing tank 131 as a pressure regulation part for storing the nitrogen gas having a second temperature (hereinafter, referred to as a "second nitrogen gas") at a desired pressure. The second heating part 130 and the pressurizing tank 131 are connected via a supply line 132, and the second heating part 130 is installed at the upstream side of the pressurizing tank 131. Also, the second heating part 130 and the pressurizing tank 131 may be integrally configured.

The second heating part 130 is not particularly limited as long as it heats the nitrogen gas to the second temperature, but for example, a sheathed heater or a heat coil is used. A nitrogen gas supply source 134 for storing a nitrogen gas at a room temperature therein is connected to the second heating part 130 via a supply line 133. A flow meter 135 for adjusting the flow rate of the nitrogen gas is installed in the supply line 133.

The pressurizing tank 131 pressurizes and stores the second nitrogen gas, and maintains the temperature of the second nitrogen gas at the second temperature by, for example, a heating mechanism such as a heater (not shown). A second nitrogen gas supply line 136 for supplying the second nitrogen gas to the cleaning chamber 100 is connected to the pressurizing tank 131 via a water vapor supply line 127. The second nitrogen gas supply line 136 is connected to the collective line 127A. In addition, a valve 137 is installed in the second nitrogen gas supply line 136.

In the present disclosure, as will be described later, the second nitrogen gas is supplied to the cleaning chamber 100 to dry the wafers W exposed to the water vapor while removing the water vapor from the cleaning chamber 100, and is also supplied to the water vapor supply line 127 to remove the water vapor in a portion of the water vapor supply line 127. Therefore, the second nitrogen gas is stored in the pressurizing tank 131 in advance, and the second nitrogen gas is supplied to the water vapor supply line 127 as quickly as possible. Furthermore, by pressurizing the second nitrogen gas in the pressurizing tank 131 in advance, the second nitrogen gas can be supplied to the water vapor supply line 127 at a high pressure, and the capacity of the pressurized tank 131 can also be reduced.

In addition, the second heating part 130 heats the nitrogen gas supplied from the nitrogen gas supply source 134 at a room temperature to the second temperature, but it takes a long heating time depending on the heating performance of the second heating part 130. Furthermore, for example, when the nitrogen gas at a room temperature is supplied to the water vapor supply line 127, it may cause dew condensation. In this respect, since the temperature of the second nitrogen gas is maintained at the second temperature in the pressurizing tank 131, such dew condensation can be prevented.

The air supply module 111 has a first heating part 140 for heating the nitrogen gas to a first temperature, for example, 50 to 100 degrees C., and a tank 141 for storing the nitrogen gas having the first temperature (hereinafter, referred to as a "first nitrogen gas"). That is, the first temperature of the nitrogen gas heated by the first heating part 140 is lower than the second temperature of the nitrogen gas heated by the second heating part 130. The first heating part 140 and the tank 141 are connected via a supply line 142, and the first heating part 140 is installed at the upstream side of the tank 141.

The first heating part 140 is not particularly limited as long as it heats the nitrogen gas to the first temperature, but for example, a sheathed heater or a heat coil is used. A nitrogen gas supply source 144 for storing the nitrogen gas at a room temperature therein is connected to the first heating part 140 via a supply line 143. A flow meter 145 for adjusting the flow rate of the nitrogen gas is installed in the supply line 143.

The tank 141 stores the first nitrogen gas and maintains the temperature of the first nitrogen gas at the first temperature by, for example, a heating mechanism such as a heater (not shown). First nitrogen gas supply lines 146A to 146C for supplying the first nitrogen gas to the cleaning chamber 100 are connected to the tank 141 via the water vapor supply line 127. The first nitrogen gas supply lines 146A to 146C are connected to branch lines 127B to 127D, respectively. In addition, valves 147A to 147C are installed in the first nitrogen gas supply lines 146A to 146C, respectively.

Then, the tank 141 supplies the first nitrogen gas equally to the branch lines 127B to 127D such that there is no pressure difference. In other words, the tank 141 functions as a buffer tank for the first nitrogen gas.

A first exhaust line 151 and a second exhaust line 152 are connected to each of the six cleaning chambers 100A to 100F. The first exhaust line 151 discharges the first nitrogen gas in each of the cleaning chambers 100A to 100F. The second exhaust line 152 discharges the water vapor and the second nitrogen gas in each of the cleaning chambers 100A to 100F. Valves 153 and 154 are installed in the first exhaust line 151 and the second exhaust line 152 connected to each of the cleaning chambers 100A to 100F, respectively.

The first exhaust line 151 is connected to the exhaust tank 160. Then, the first nitrogen gas discharged from each of the cleaning chambers 100A to 100F is collectively exhausted to the exhaust tank 160. Furthermore, the second exhaust line 152 is connected to the exhaust tank 160 via a pump 161 and a gas-liquid separation tank 162. The water vapor and the second nitrogen gas discharged from each of the cleaning chambers 100A to 100F are sucked by the pump 161 and separated into a gas and a liquid by the gas-liquid separation tank 162, and the gas is then exhausted to the exhaust tank 160.

Furthermore, as described above, in the first embodiment, the two wafers W are processed using the two cleaning chambers 100. For example, when the two wafers W are water vapor-processed in the pair of cleaning chambers 100A and 100B, control is performed by measuring a pressure of the water vapor supply line 127 (P1 in FIG. 3) and a pressure of the second exhaust line 152 (P2 in FIG. 3) and sending a signal to an automatic butterfly valve such that a differential pressure (AP in FIG. 3) therebetween is equal in the cleaning chambers 100A and 100B. By doing so, a water vapor process can be uniformly performed in the cleaning chambers 100A and 100B.

Furthermore, each member of the wafer cleaning module 33 is heated by, for example, a heater (not shown), in order to prevent deposits from being adhered to the inside thereof. The members to be heated are, for example, the cleaning chamber 100, the water vapor supply line 127, the second nitrogen gas supply line 136, the first nitrogen gas supply lines 146A to 146C, the first exhaust line 151, the second exhaust line 152, and the like. Furthermore, the set temperature of the heater is, for example, 50 to 100 degrees C.

Figure 4:
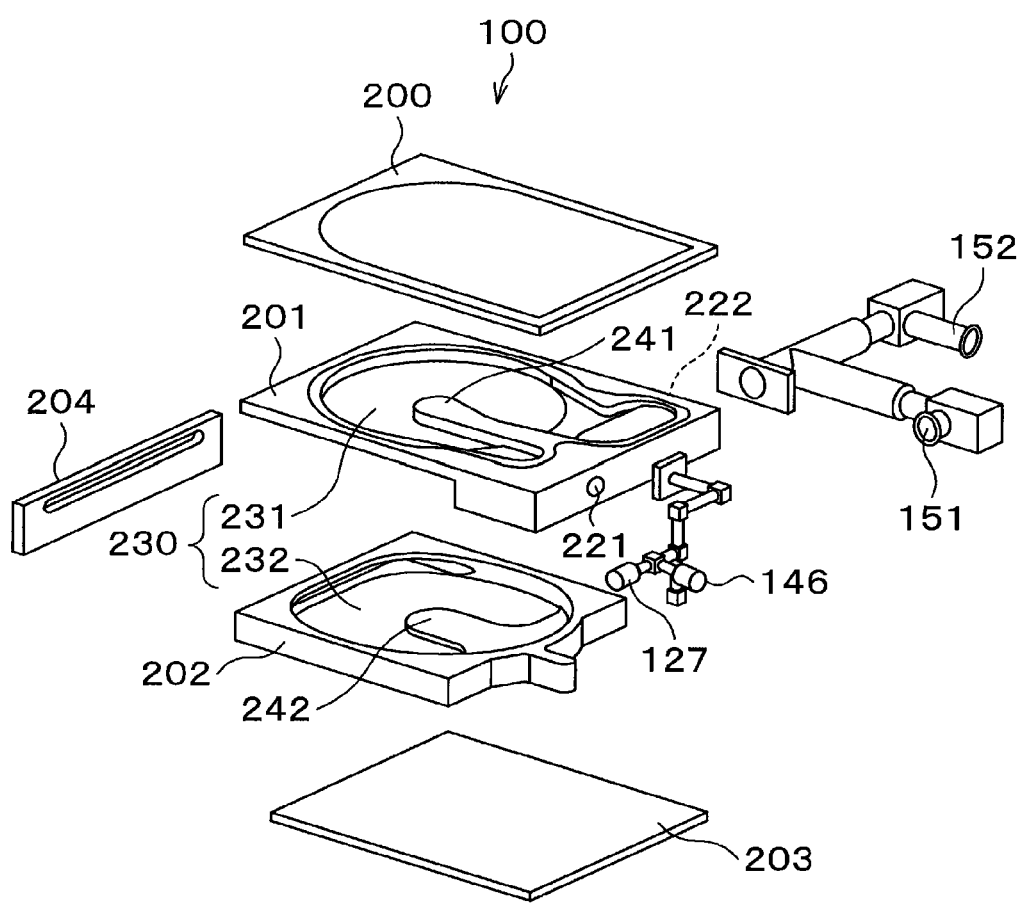
FIG. 4 is an explanatory view illustrating an outline of a configuration of a cleaning chamber according to the first embodiment.
Figure 5:
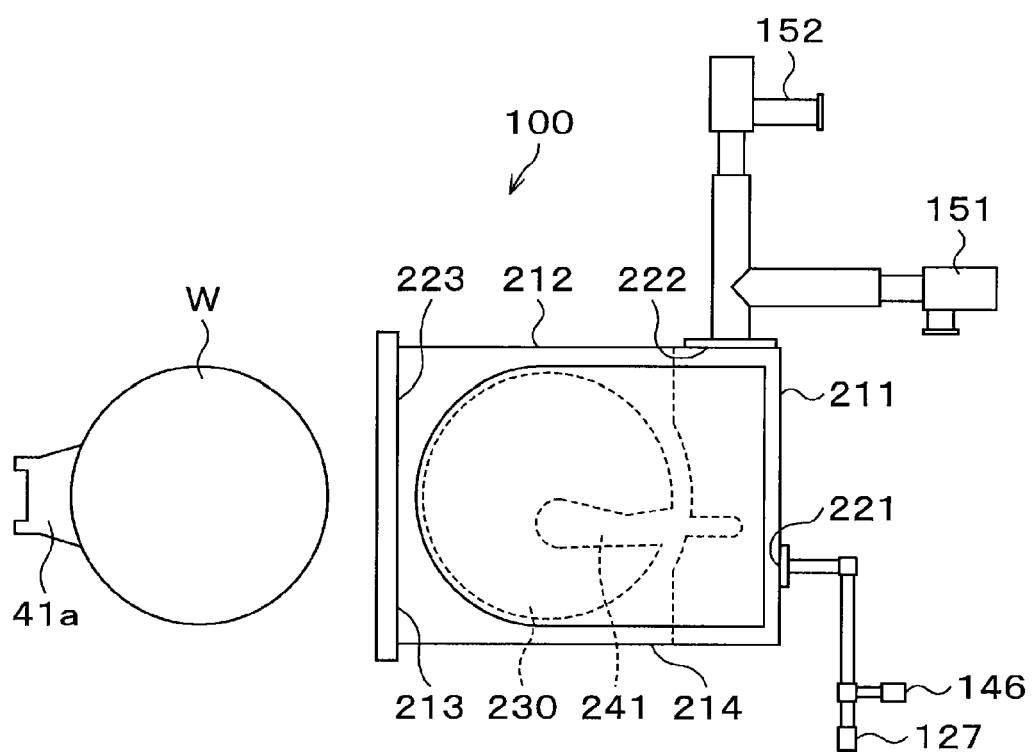
FIG. 5 is a plan view illustrating an outline of a configuration of the cleaning chamber according to the first embodiment.
Figure 6:
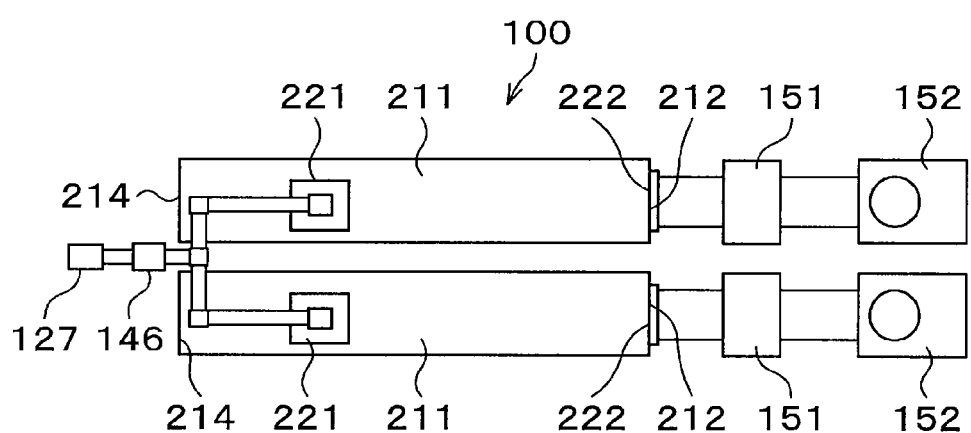
FIG. 6 is a side view illustrating an outline of a configuration of the cleaning chamber according to the first embodiment.

Next, a configuration of the cleaning chamber 100 will be described. FIG. 4 is an explanatory view illustrating an outline of the configuration of the cleaning chamber 100. FIG. 5 is a plan view illustrating an outline of the configuration of the cleaning chamber 100. FIG. 6 is a side view illustrating an outline of the configuration of the cleaning chamber 100.

The cleaning chamber 100 is configured by stacking a ceiling plate 200, a first internal member 201, a second internal member 202, and a bottom plate 203 sequentially from top to bottom. In addition, a gate 204, which can be opened and closed in order to load and unload the wafers W into and from the cleaning chamber 100, is installed in the cleaning chamber 100.

The cleaning chamber 100 has a substantially rectangular parallelepiped shape, and has a first sidewall 211, a second sidewall 212, a third sidewall 213, and a fourth sidewall 214. The first sidewall 211 and the third sidewall 213 face each other, and the second sidewall 212 and the fourth sidewall 214 face each other.

The water vapor supply line 127 is connected to the first sidewall 211 to form a supply port 221 for the water vapor, the first nitrogen gas, and the second nitrogen gas from the water vapor supply line 127. The first exhaust line 151 and the second exhaust line 152 are connected to the second sidewall 212 to form an exhaust port 222 for exhausting the interior of the cleaning chamber 100. The area of the exhaust port 222 is larger than the area of the supply port 221. A loading/unloading port 223 for the wafers W is formed on the third sidewall 213. The gate 204 described above is installed on the third sidewall 213.

An accommodation space 230 for accommodating one wafer W is formed in the cleaning chamber 100. That is, substantially circular openings 231 and 232 in plan view are formed in the first internal member 201 and the second internal member 202, respectively, and a space surrounded by these openings 231 and 232, the ceiling plate 200, and the bottom plate 203 becomes the accommodation space 230.

Since this accommodation space 230 is configured to be small, it is possible to suppress the supply amount of necessary gases (the water vapor, the first nitrogen gas, and the second nitrogen gas). In addition, it is possible to suppress dew condensation in the accommodation space 230.

A fin 241 protruding from the first sidewall 211 side to the third sidewall 213 side in the opening 231 is provided in the first internal member 201. The fin 241 is not in contact with the third sidewall 213 of the opening 231. Furthermore, the fin 241 is arranged nearer to the supply port 221 than to the exhaust port 222 in plan view. The shape of the fin 241 is not particularly limited, but for example, the leading end portion thereof has an arc shape in plan view.

A protrusion 242 protruding from the first sidewall 211 side to the third sidewall 213 side in the opening 232 is provided in the second internal member 202. The wafer W accommodated in the accommodation space 230 is arranged to be supported by a pad (not shown) provided on the bottom plate 203 between the fin 241 and the protrusion 242 in the vertical direction, without making contact with the fin 241 and the protrusion 242. At this time, the interval between the surface of the wafer W and a lower surface of the ceiling plate 200 is, for example, 40 mm. Furthermore, the fin 241 is arranged so as to cover the wafer W in plan view when the wafer W is accommodated in the accommodation space 230.

Figure 7:
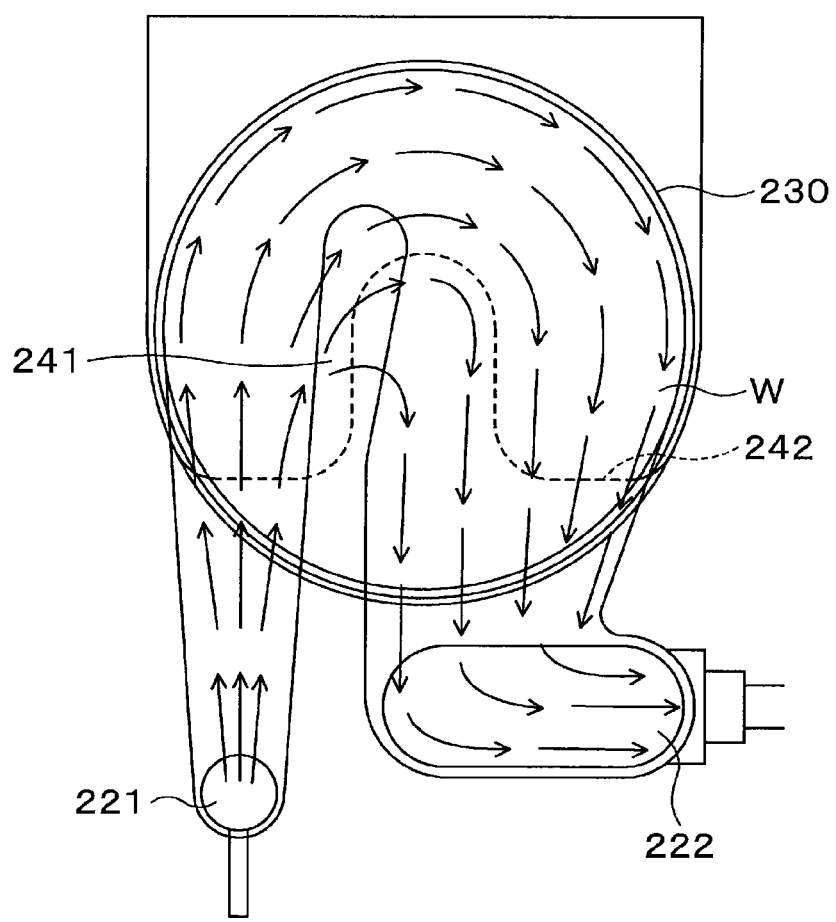
FIG. 7 is an explanatory view illustrating a flow path of a gas supplied from a supply port in the cleaning chamber according to the first embodiment.

FIG. 7 is an explanatory view illustrating a flow path of a gas supplied from the supply port 221 in the cleaning chamber 100. In the illustrated example, the flow of the water vapor is indicated by arrows, but the same applies to a flow of the first nitrogen gas or the second nitrogen gas.

The water vapor supplied from the supply port 221 flows toward the exhaust port 222 through the surface (upper surface) of the wafer W. At this time, the water vapor flows in a substantially U shape along an inner side surface of the cleaning chamber 100 (a side surface of the accommodation space 230) and an outer side surface of the fin 241 formed above the wafer W. Then, the entire surface of the wafer W is uniformly exposed to the water vapor.

Figure 8:
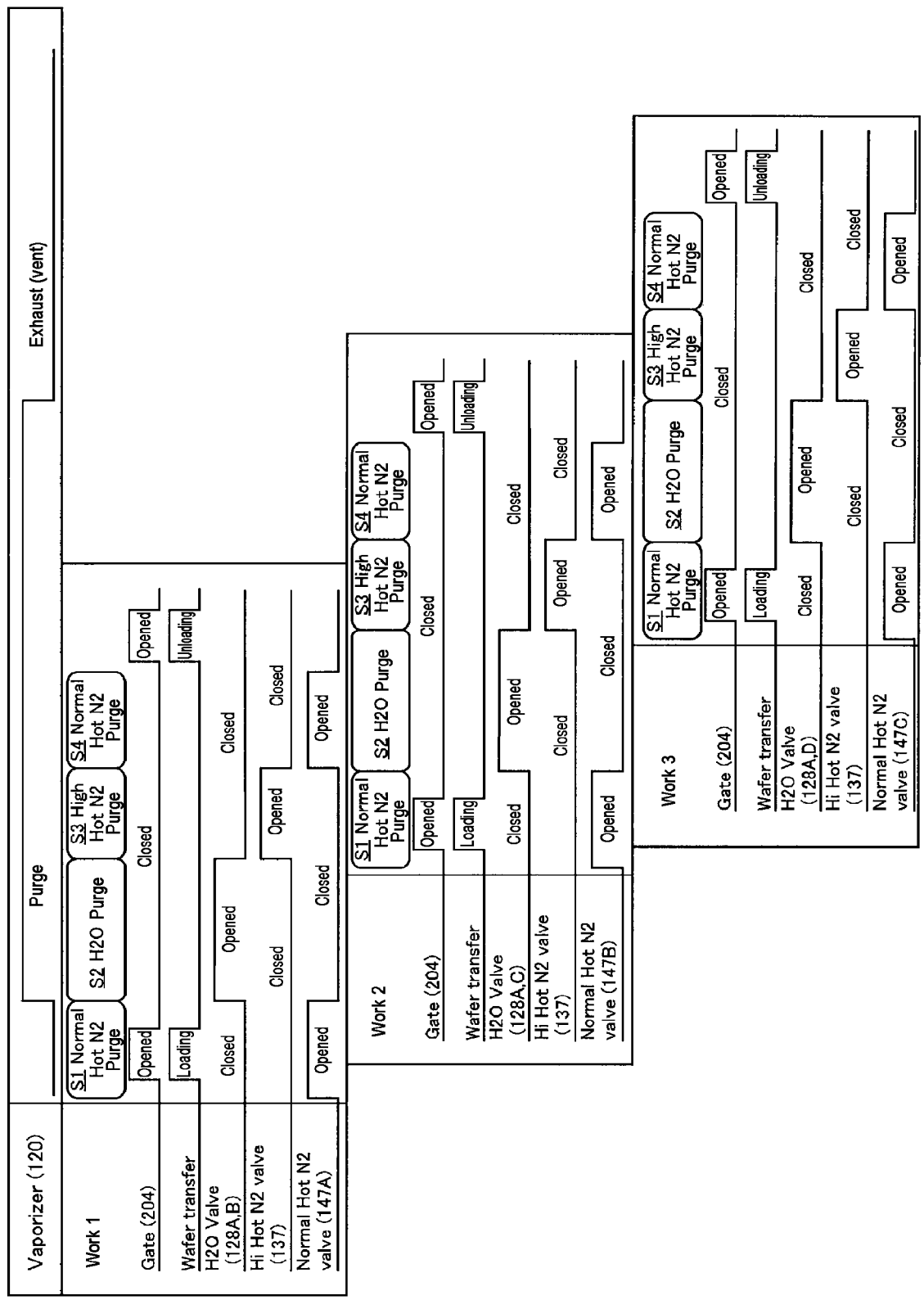
FIG. 8 is an explanatory view illustrating an operation of the wafer cleaning module in a wafer cleaning process according to the first embodiment.

The wafer cleaning module 33 of the first embodiment is configured as described above. Next, the cleaning process of the wafer W in the wafer cleaning module 33 will be described. FIG. 8 is an explanatory view illustrating an operation of the wafer cleaning module 33 in the cleaning process of the wafer W. In the first embodiment, two wafers W are processed in parallel in each of the pair of cleaning chambers 100A and 100B, the pair of cleaning chambers 100C and 100D, and the pair of cleaning chambers 100E and 100F. In the following description, the processing of the cleaning chambers 100A and 100B may be referred to as work 1, the processing of the cleaning chambers 100C and 100D may be referred to as work 2, and the processing of the cleaning chambers 100E and 100F may be referred to as work 3.

First, the work 1 will be described. In the work 1, a first nitrogen gas supply process S1 (normal hot $N_2$ purge), a water vapor supply process S2 ($H_2O$ purge), a second nitrogen gas supply process S3 (high hot $N_2$ purge), and a first nitrogen gas supply process S4 (normal hot $N_2$ purge) are sequentially performed.

[First Nitrogen Gas Supply Process S1 (Normal Hot $N_2$ Purge)]

At this process S1, the valve 147A is opened to supply a first nitrogen gas heated to a first temperature, for example, 50 to 100 degrees C., by the first heating part 140 to each of the cleaning chambers 100A and 100B. At this time, since the first nitrogen gas heated by the first heating part 140 is firstly stored in the tank 141, it is supplied to the cleaning chambers 100A and 100B so that there is no pressure difference. In each of the cleaning chambers 100A and 100B, the internal gas (mainly the first nitrogen gas) is discharged through the first exhaust line 151 while the first nitrogen gas is supplied under an atmospheric pressure.

While the first nitrogen gas is supplied to the cleaning chambers 100A and 100B in this way, the gates 204 of the respective cleaning chambers 100A and 100B are opened and two wafers W are loaded thereinto. In the first embodiment, the gates 204 of the cleaning chambers 100A and 100B are simultaneously opened and closed. Furthermore, when the interval between the transfer arms 41a and 41b coincides with the interval between the cleaning chambers 100A and 100B, the two wafers W are simultaneously loaded thereinto, and when the intervals do not coincide with each other, the two wafers W are separately loaded thereinto. Then, each wafer W is adjusted to a desired temperature by the first nitrogen gas. In the present disclosure, as will be described later, at the next process S2, fluorine on the surface of the wafer W is removed by water vapor, but if the temperature of the wafer W is too high, fluorine cannot be appropriately removed. Therefore, at this process S1, the wafer W is put in a state where fluorine is removed by adjusting the wafer W to a desired temperature, for example, 50 to 80 degrees C. Furthermore, the adjustment of the temperature of the wafer W is performed by adjusting the supply flow rate and the supply time of the nitrogen gas by the flow meter 145, in addition to the temperature of the first nitrogen gas.

[Water Vapor Supply Process S2 ($H_2O$ Purge)]

At this process S2, the valves 128A and 128B are opened to supply water vapor generated by the vaporizer 120 to each of the cleaning chambers 100A and 100B. In each of the cleaning chambers 100A and 100B, the internal gas (mainly the water vapor) is discharged through the second exhaust line 152 while the water vapor is supplied under an atmospheric pressure. The temperature of the water vapor is, for example, 50 to 100 degrees C., and the concentration of the water vapor is 70 to 90%. Furthermore, the supply amount of the water vapor is 50 $g/m^3$ or more.

As described above, fluorine may remain on the surface of the wafer W after the COR process and the PHT process are performed. At this process S2, the water vapor reacts with the fluorine by exposing the surface of the wafer W to the water vapor, to remove the fluorine. Furthermore, at this time, since the fin 241 is formed in the cleaning chambers 100A and 100B, as illustrated in FIG. 7, the water vapor flows in a substantially U shape along the inner side surface of the cleaning chamber 100 (the side surface of the accommodation space 230) and the outer side surface of the fin 241 formed on the wafer W. By doing so, since the entire surface of the wafer W is uniformly exposed to the water vapor, the reaction between the water vapor and the fluorine is promoted, thereby appropriately removing the fluorine.

[Second Nitrogen Gas Supply Process S3 (High Hot $N_2$ Purge)]

At this process S3, the valve 137 is opened to supply a second nitrogen gas heated to a second temperature, for example, 120 to 300 degrees C., more preferably 200 to 300 degrees C., by the second heating part 130 to each of the chambers 100A and 100B. At this time, the second nitrogen gas heated by the second heating part 130 is firstly stored in the pressurizing tank 131, thereby being pressurized. Therefore, when switching from the water vapor to the second nitrogen gas, the second nitrogen gas can be supplied instantaneously and at a high pressure. In each of the cleaning chambers 100A and 100B, the internal gas (mainly the second nitrogen gas) is discharged through the second exhaust line 152 while the second nitrogen gas is supplied under an atmospheric pressure.

The wafer W exposed to the water vapor at the previous process S2 can be dried by the second nitrogen gas of a high temperature. Furthermore, the water vapor remaining in the cleaning chamber 100 is removed, and the water vapor remaining in a portion of the collective line 127A of the water vapor supply line 127 and in the branch line 127B is also removed, and hence, the water vapor remaining in the second exhaust line 152 is removed. Dew condensation is suppressed by removing the water vapor from the cleaning chamber 100, the water vapor supply line 127, and the second exhaust line 152 in this way. In order to remove the water vapor in the collective line 127A, the second nitrogen gas supply line 136 is preferably connected to the upstream side of the collective line 127A as much as possible.

[First Nitrogen Gas Supply Process S4 (Normal Hot $N_2$ Purge)]

At this process S4, the valve 147A is opened to supply the first nitrogen gas heated to the first temperature, for example, 50 to 100 degrees C., by the first heating part 140 to each of the cleaning chambers 100A and 100B. In each of the cleaning chambers 100A and 100B, the internal gas (mainly the first nitrogen gas) is discharged through the first exhaust line 151 while the first nitrogen gas is supplied under an atmospheric pressure.

The wafers W are adjusted to a desired temperature by the first nitrogen gas. The desired temperature of the wafers W at this time is a temperature, for example, 80 degrees C. or lower, at which the wafer transfer mechanism 40 can transfer the wafers W. If the temperature of the wafers W does not significantly rise after the previous process S3 and is maintained at, for example, 80 degrees C. or lower, the temperature adjustment of the wafers W at this process S4 may be omitted.

When the series of processes S1 to S4 of the work 1 in the cleaning chambers 100A and 100B described above is completed, the gates 204 of the respective cleaning chambers 100A and 100B are opened and the two wafers W are unloaded therefrom.

Similar to the work 1, in the work 2 and the work 3, the first nitrogen gas supply process S1 (normal hot $N_2$ purge), the water vapor supply process S2 ($H_2O$ purge), the second nitrogen gas supply process S3 (high hot $N_22$ purge), and the first nitrogen gas supply process S4 (normal hot $N_2$ purge) are sequentially performed.

However, in the works 1 to 3, the timings of performing the respective processes S1 to S4 are different. This is because the vaporizer 120, the second heating part 130 and the pressurizing tank 131, and the first heating part 140 and the tank 141 are respectively installed in common in the respective cleaning chambers 100A to 100F. In the work 2, a series of processes starts after the water vapor supply process S2 of the work 1 is completed. Furthermore, in the work 3, a series of processes starts after the water vapor supply process S2 of the work 2 is completed.

In addition, in order to facilitate the illustration in the first embodiment, it was described that the first nitrogen gas supply process S1 of the work 2 starts after the water vapor supply process S2 of the work 1 is completed. However, in the work 2, the wafers W may actually be loaded into the cleaning chambers 100C and 100D during the first nitrogen gas supply process S1 or the water vapor supply process S2 of the work 1. In such a case, although the wafers W become a standby state, the first nitrogen gas is supplied into the cleaning chambers 100C and 100D.

According to the first embodiment, the water vapor on the surface of the wafer W can be removed by the second nitrogen gas having a high temperature at the second nitrogen gas supply process S3 while removing the fluorine on the surface of the wafers W by the water vapor at the water vapor supply process S2. Thus, the cleaning process of the wafers W after the COR process and the PHT process are performed can be appropriately performed.

Furthermore, since the wafers W are adjusted to a desired temperature by the first nitrogen gas at the first nitrogen gas supply process S1, the fluorine on the surface of the wafers W can be appropriately removed at the next water vapor supply process S2.

In addition, since the wafers W are adjusted to a desired temperature by the first nitrogen gas at the first nitrogen gas supply process S4, the wafers W can be transferred by the wafer transfer mechanism 40 and can be returned to the FOUP 31 as it is. Furthermore, in the conventional wafer processing apparatus, after the COR process and the PHT process are performed, a cooling storage (CST) process was performed to adjust (cool) the temperature of the wafers W, but in the first embodiment, such CST process may be omitted.

Moreover, in the first embodiment, the fluorine is removed at the water vapor supply process S2, but the first embodiment may be applied to, e.g., a case where, in addition to the fluorine, ammonia or the like, chlorine-based material, carbon-based material, or halogen or the like is removed.

Exemplary Modification of the First Embodiment

Figure 9:
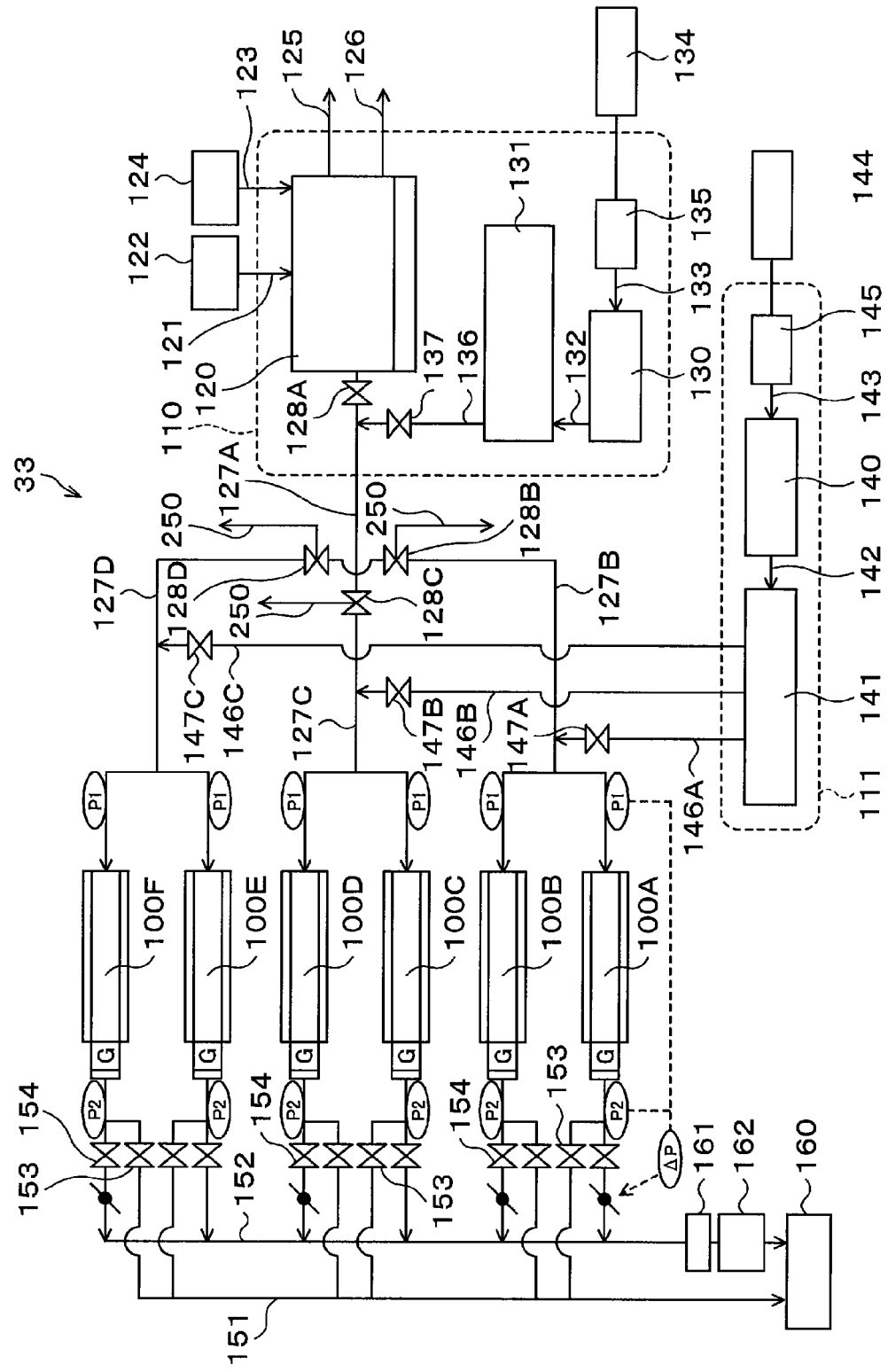
FIG. 9 is an explanatory view illustrating an outline of a configuration of a wafer cleaning module according to an exemplary modification of the first embodiment.

The wafer cleaning module 33 of the first embodiment described above may further have a vent line 250, as illustrated in FIG. 9. Four-way valves are used for the valves 128B to 128D of the branch lines 127B to 127D, and the vent line 250 is installed for each of the valves 128B to 128D. The vent line 250 is connected to the gas-liquid separation tank 162.

In the first embodiment described above, the switching of the water vapor supply of the works 1 to 3 at the water vapor supply process S2 was performed by the valves 128B to 128D. For example, in the work 1, the valve 128B is opened to supply the water vapor to the cleaning chambers 100A and 100B, and the valves 128C and 128D are closed to prevent the water vapor from being supplied to the cleaning chambers 100C to 100F.

In contrast, in this modification, the switching of the water vapor supply of the works 1 to 3 is performed by discharging the water vapor from the vent line 250. That is, for example, in the work 1, the water vapor is supplied from the vaporizer 120 to all of the branch lines 127B to 127D. However, in the valve 128B, the vent line 250 side is closed and the water vapor is supplied to the cleaning chambers 100A and 100B. On the other hand, in the valves 128C and 128D, the vent line 250 side is opened to discharge the water vapor from the vent line 250 so that the water vapor is not supplied to the cleaning chambers 100C to 100F. Even in this modification, it is possible to appropriately perform the switching of the water vapor supply of the works 1 to 3.

Furthermore, the wafer cleaning module 33 of the first embodiment described above may have an HF monitor (not shown). The HF monitor is installed in, for example, the cleaning chamber 100. As described above, at the water vapor supply process S2, the water vapor reacts with the fluorine to remove the fluorine, and at this time, hydrogen fluoride (HF) is generated. Therefore, by monitoring the hydrogen fluoride generated in the cleaning chamber 100 using the HF monitor, it is possible to confirm whether or not a fluorine removal process is properly performed.

The detection of hydrogen fluoride by the HF monitor may be performed during the activation (start-up) of the wafer cleaning module 33. In such a case, process conditions such as a water vapor processing time or the like can be determined based on the detection result by the HF monitor. Furthermore, the process conditions may be controlled in real time based on the detection result by the HF monitor.

Moreover, in the wafer cleaning module 33 of the first embodiment described above, the second heating part 130 and the pressurizing tank 131 are installed in the same air supply module 110 as the vaporizer 120, but may be installed in any module different from the vaporizer 120.

Furthermore, in the wafer cleaning module 33 of the first embodiment described above, the common vaporizer 120, the second heating part 130 and the pressurizing tank 131, and the first heating part 140 and the tank 141 are common for the six cleaning chambers 100, but they may be individually installed.

Second Embodiment

Figure 10:
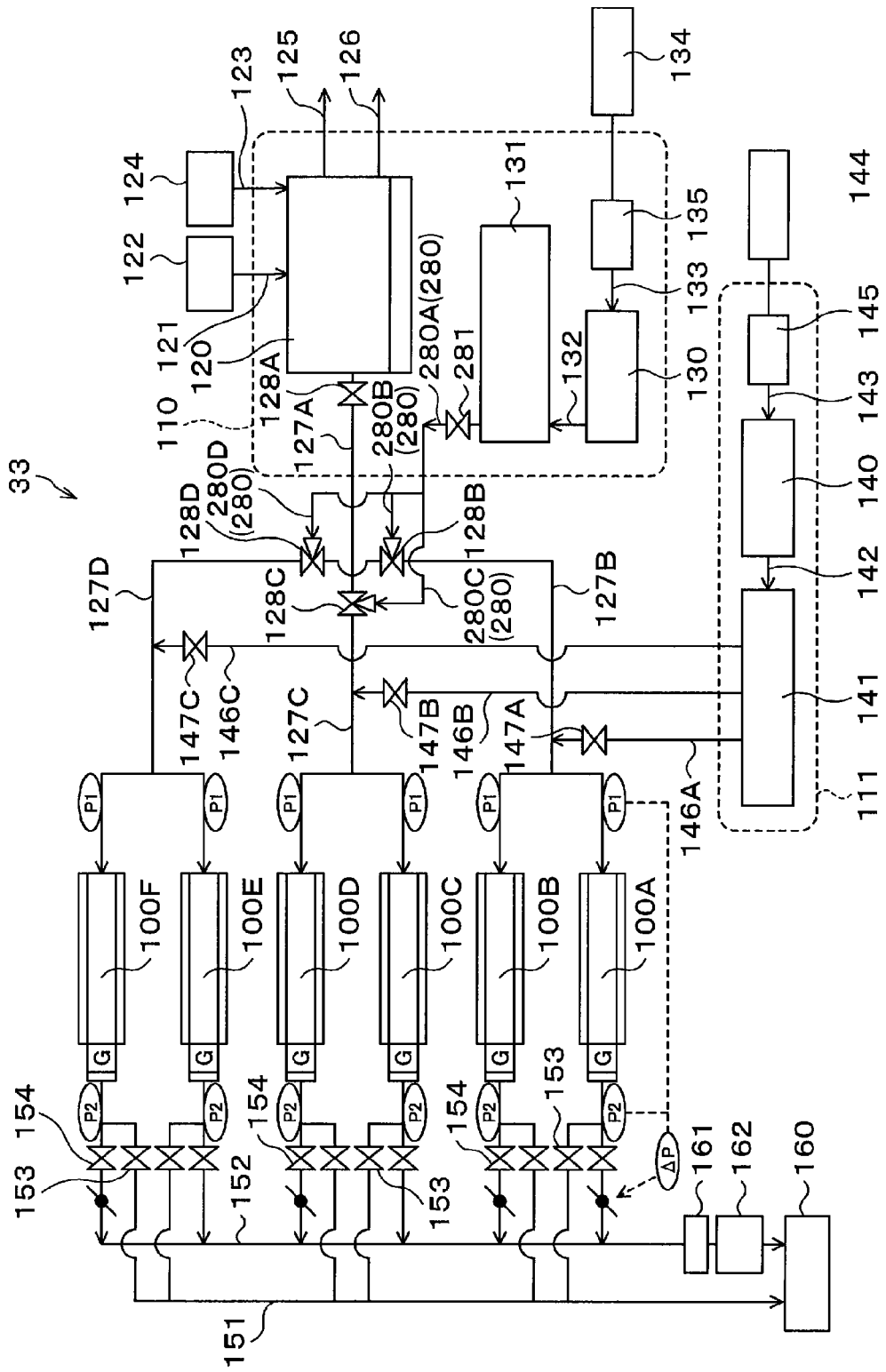
FIG. 10 is an explanatory view illustrating an outline of a configuration of a wafer cleaning module according to a second embodiment of the present disclosure.

Next, a configuration of a wafer cleaning module 33 according to a second embodiment of the present disclosure will be described. FIG. 10 is an explanatory view illustrating an outline of a configuration of the wafer cleaning module 33.

In the first embodiment, the second nitrogen gas supply line 136 from the pressurizing tank 131 was connected to the collective line 127A, but in the second embodiment, the second nitrogen gas supply line 280 from the pressurizing tank 131 is connected to the valves 128B to 128D. Other components of the wafer cleaning module 33 of the second embodiment are similar to the components of the wafer cleaning module 33 of the first embodiment.

The second nitrogen gas supply line 280 has a collective line 280A connected to the pressurizing tank 131 and branch lines 280B to 280D branched from the collective line 280A and connected to the valves 128B to 128D. In such a case, for example, a four-way valve is used for each of the valves 128B to 128D. In addition, a valve 281 is installed in the collective line 280A.

Figure 11:
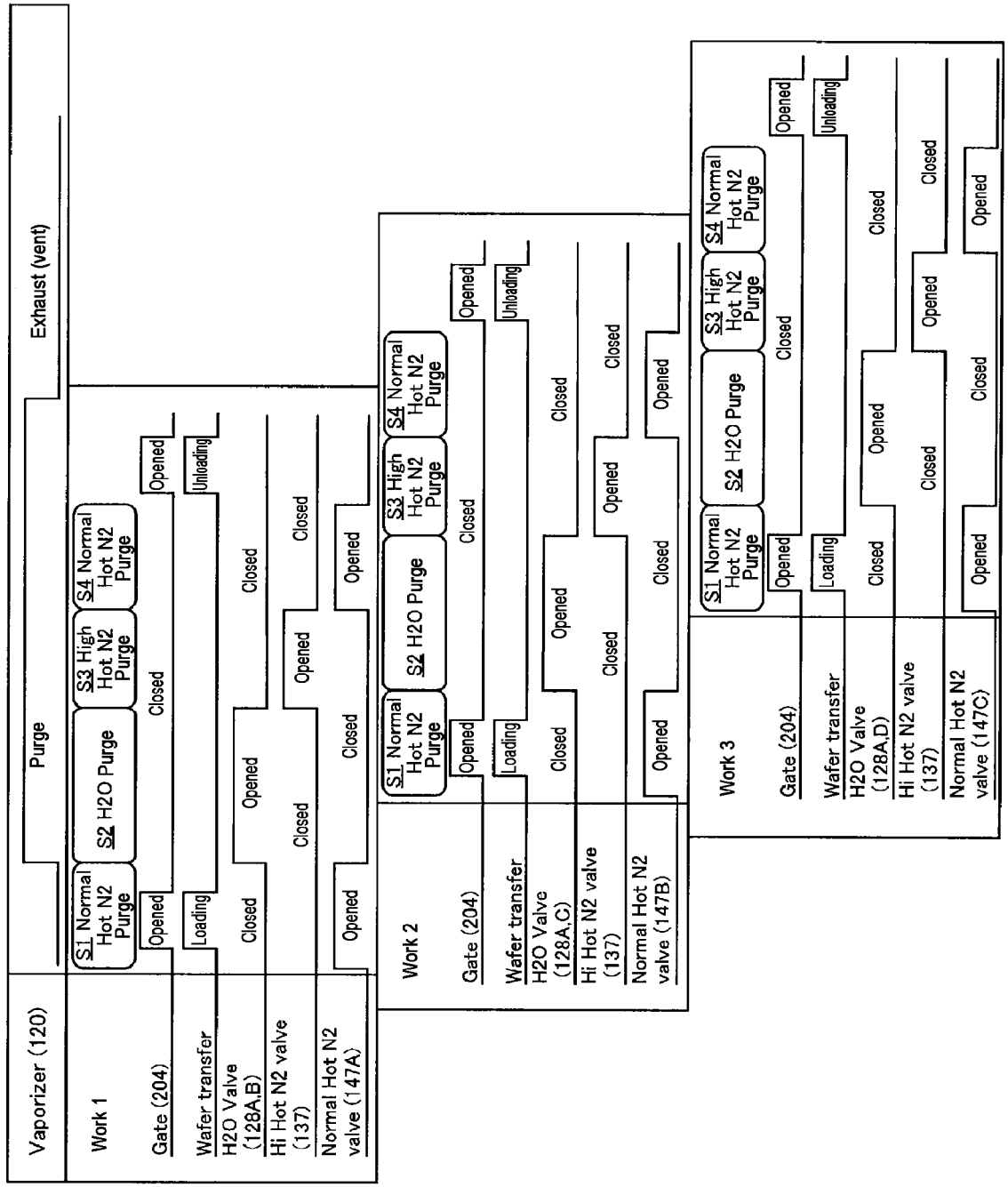
FIG. 11 is an explanatory view illustrating an operation of the wafer cleaning module in a wafer cleaning process according to the second embodiment.

FIG. 11 is an explanatory view illustrating an operation of the wafer cleaning module 33 in the cleaning process of the wafers W. Similar to the first embodiment, in the second embodiment, in the works 1 to 3, the first nitrogen gas supply process S1 (normal hot $N_2$ purge), the water vapor supply process S2 ($H_2O$ purge), the second nitrogen gas supply process S3 (high hot $N_2$ purge), and the first nitrogen gas supply process S4 (normal hot $N_2$ purge) are sequentially performed. However, in the first embodiment and the second embodiment, the timings of performing the work 2 and the work 3 are different.

In the first embodiment, the water vapor supply process S2 of the work 2 started after the second nitrogen gas supply process S3 of the work 1 is completed, but in the second embodiment, the water vapor supply process S2 of the work 2 starts after the water vapor supply process S2 of the work 1 is completed. In the first embodiment, since the second nitrogen gas supply line 136 was connected to the collective line 127A, the supply of the water vapor and the supply of the second nitrogen gas cannot be performed in parallel. In contrast, in the second embodiment, the branch lines 280B to 280D of the second nitrogen gas supply line 280 are directly connected to the valves 128B to 128D. Therefore, for example, by controlling the opening and closing of the valves 128B and 128C, the water vapor can be supplied to the cleaning chambers 100C and 100D of the work 2 while supplying the second nitrogen gas to the cleaning chambers 100A and 100B of the work 1. Thus, in the second embodiment, it is possible to shorten the time required for the second nitrogen gas supply process S3 of the work 1 in the first embodiment.

Furthermore, in the second embodiment, the second nitrogen gas supply process S3 of the work 1 and the water vapor supply process S2 of the work 2 are performed in parallel. In such a case, if the exhaust from the cleaning chambers 100A and 100B (mainly the second nitrogen gas) in the work 1 and the exhaust from the cleaning chambers 100C and 100D in the work 2 (mainly the water vapor) are performed in the same exhaust line, exhaust interference occurs. Therefore, in the first exhaust line 151, the first nitrogen gas and the second nitrogen gas in each of the cleaning chambers 100A to 100F are discharged, and in the second exhaust line 152, the water vapor in each of the cleaning chambers 100A to 100F is discharged.

Moreover, in the second embodiment, the water vapor supply process S2 of the work 3 starts after the water vapor supply process S2 of the work 2 is completed. Thus, in the second embodiment, it is also possible to shorten the time required for the second nitrogen gas supply process S3 of the work 2 in the first embodiment.

According to the second embodiment, the same effects as those of the first embodiment can be achieved. Moreover, it is possible to shorten the whole processing time of the works 1 to 3.

Third Embodiment

Figure 12:
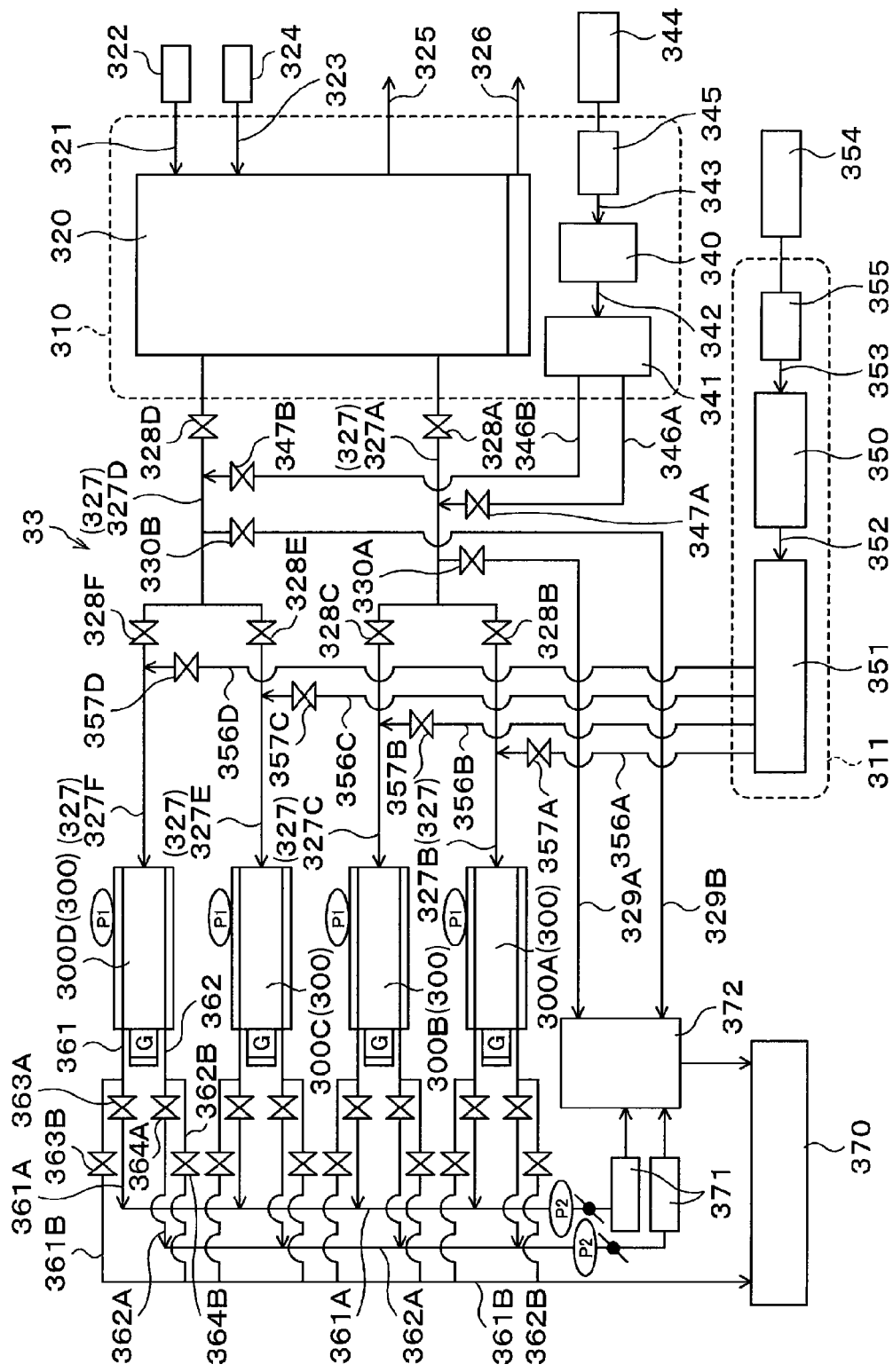
FIG. 12 is an explanatory view illustrating an outline of a configuration of a wafer cleaning module according to a third embodiment of the present disclosure.

Next, a configuration of a wafer cleaning module 33 according to a third embodiment of the present disclosure will be described. FIG. 12 is an explanatory view illustrating an outline of the configuration of the wafer cleaning module 33.

In the first and second embodiments described above, one wafer W is accommodated and processed in one cleaning chamber 100, but in the third embodiment, two wafers W are accommodated and processed in one cleaning chamber 300.

The wafer cleaning module 33 has the cleaning chamber 300 that accommodates two wafers W. A plurality of cleaning chambers, for example, four cleaning chambers 300, are installed to be vertically stacked on one side surface forming the short side of the housing of the loader module 30. In the following description, these four cleaning chambers 300 may be referred to as cleaning chambers 300A to 300D from the lower stage to the upper stage. The number of cleaning chambers 300 is not limited to the third embodiment but may be arbitrarily set.

Two air supply modules 310 and 311 are connected to each of the four cleaning chambers 300A to 300D. The air supply module 310 supplies water vapor and a second nitrogen gas to the cleaning chamber 300. The air supply module 311 supplies a first nitrogen gas to the cleaning chamber 300.

The air supply module 310 has a vaporizer 320 that generates water vapor and supplies it to the cleaning chamber 300. A configuration of the vaporizer 320 is similar to the configuration of the vaporizer 120 in the first embodiment. In addition, a pure water supply source 322 is connected to the vaporizer 320 via a supply line 321 and a nitrogen gas supply source 324 is connected thereto via a supply line 323. Furthermore, a vent line 325 and a drain 326 are connected to the vaporizer 320.

The cleaning chambers 300A and 300B and the vaporizer 320 are connected by two water vapor supply lines 327. The water vapor supply line 327 connecting the cleaning chambers 300A and 300B and the vaporizer 320 has a collective line 327A connected to the vaporizer 320, and branch lines 327B and 327C branched from the collective line 327A and connected to each of the cleaning chambers 300A and 300B. Similarly, the water vapor supply line 327 connecting the cleaning chambers 300C and 300D and the vaporizer 320 has a collective line 327D connected to the vaporizer 320, and branch lines 327E and 327F branched from the collective line 327D and connected to each of the cleaning chambers 300C and 300D. Valves 328A to 328F are installed in the collective line 327A, the branch line 327B and 327C, the collective line 327D, and the branch lines 327E and 327F, respectively.

Vent lines 329A and 329B are installed in the collective lines 327A and 327D, respectively. The vent lines 329A and 329B are each connected to a gas-liquid separation tank 372, which will be described later. In addition, valves 330A and 330B are installed in the vent lines 329A and 329B, respectively.

The air supply module 310 further has a second heating part 340 for heating a nitrogen gas to a second temperature, for example 120 to 300 degrees C., more preferably 200 to 300 degrees C., and a pressurizing tank 341 for storing the second nitrogen gas at a desired pressure. The second heating part 340 and the pressurizing tank 341 are connected via a supply line 342, and the second heating part 340 is installed at the upstream side of the pressurizing tank 341.

The configurations of the second heating part 340 and the pressurizing tank 341 are similar to the configurations of the second heating part 130 and the pressurizing tank 131 in the first embodiment, respectively. In addition, a nitrogen gas supply source 344 for storing the nitrogen gas at a room temperature therein is connected to the second heating part 340 via a supply line 343. A flow meter 345 for adjusting the flow rate of the nitrogen gas is installed in the supply line 343. Second nitrogen gas supply lines 346A and 346B for supplying a second nitrogen gas to the cleaning chamber 300 via the water vapor supply line 327 is connected to the pressurizing tank 341. The second nitrogen gas supply lines 346A and 346B are connected to the collective lines 327A and 327D, respectively. Furthermore, valves 347A and 347B are installed in the second nitrogen gas supply lines 346A and 346B, respectively.

The air supply module 311 has a first heating part 350 for heating the nitrogen gas to a first temperature, for example, 50 to 100 degrees C., and a tank 351 for storing the first nitrogen gas. The first heating part 350 and the tank 351 are connected via a supply line 352, and the first heating part 350 is installed at the upstream side of the tank 351.

The configurations of the first heating part 350 and the tank 351 are similar to the configurations of the first heating part 140 and the tank 141 in the first embodiment, respectively. In addition, a nitrogen gas supply source 354 for storing the nitrogen gas at a room temperature therein is connected to the first heating part 350 via a supply line 353. A flow meter 355 for adjusting the flow rate of the nitrogen gas is installed in the supply line 353. First nitrogen gas supply lines 356A to 356D for supplying the first nitrogen gas to the cleaning chamber 300 are connected to the tank 351 via the water vapor supply line 327. The first nitrogen gas supply lines 356A to 356D are connected to the branch lines 327B, 327C, 327E and 327F, respectively. In addition, valves 357A to 357D are installed in the first nitrogen gas supply lines 356A to 356D, respectively.

A first exhaust line 361 and a second exhaust line 362 are connected to each of the four cleaning chambers 300A to 300D. The first exhaust line 361 discharges the water vapor and the first nitrogen gas in each of the cleaning chambers 300A to 300D. The first exhaust line 361 is branched into a first water vapor exhaust line 361A and a first nitrogen gas exhaust line 361B. Valves 363A and 363B are installed in the first water vapor exhaust line 361A and the first nitrogen gas exhaust line 361B, respectively. The second exhaust line 362 discharges the water vapor and the second nitrogen gas in each of the cleaning chambers 300A to 300D. The second exhaust line 362 is branched into a second water vapor exhaust line 362A and a second nitrogen gas exhaust line 362B. Valves 364A and 364B are installed in the second water vapor exhaust line 362A and the second nitrogen gas exhaust line 362B, respectively.

The first nitrogen gas exhaust line 361B and the second nitrogen gas exhaust line 362B are each connected to the exhaust tank 370. Then, the first nitrogen gas and the second nitrogen gas discharged from the cleaning chambers 300A to 300D are collectively exhausted to the exhaust tank 370 via the first nitrogen gas exhaust line 361B and the second nitrogen gas exhaust line 362B, respectively.

The first water vapor exhaust line 361A and the second water vapor exhaust line 362A are connected to the exhaust tank 370 via a pump 371 and a gas-liquid separation tank 372, respectively. The water vapor discharged from each of the cleaning chambers 100A to 100F is sucked by the pump 371, separated into a gas and a liquid by the gas-liquid separation tank 372, and then the gas is exhausted to the exhaust tank 370.

Figure 13:
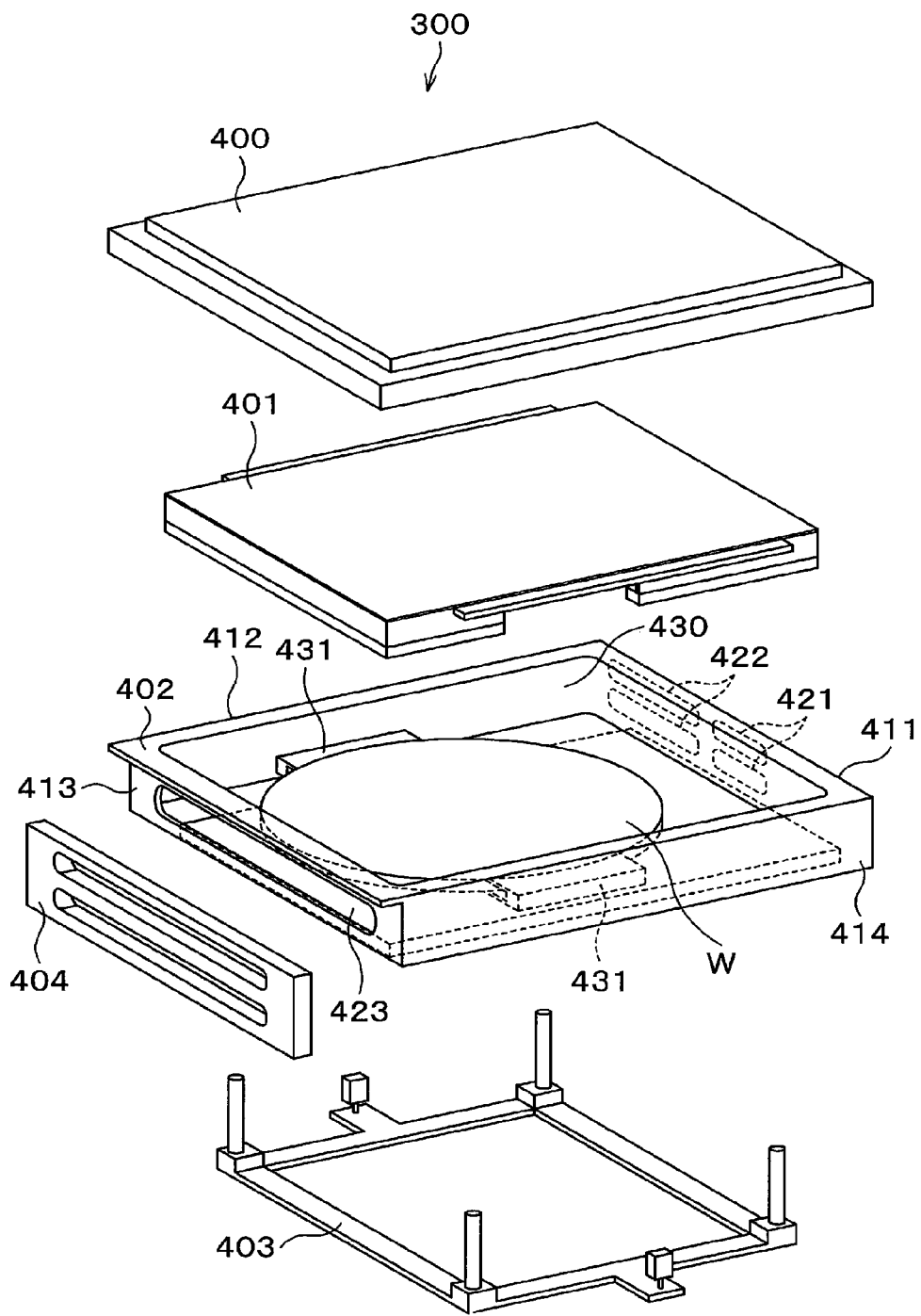
FIG. 13 is an explanatory view illustrating an outline of a configuration of a cleaning chamber according to the third embodiment.

Next, a configuration of the cleaning chamber 300 will be described. FIG. 13 is an explanatory view illustrating an outline of the configuration of the cleaning chamber 300.

The cleaning chamber 300 is configured by stacking a fastening plate 400, a cap portion 401, an accommodation portion 402, and a fastening member 403 sequentially from top to bottom. The cap portion 401 is arranged so as to be fitted into the accommodation portion 402, and the fastening plate 400 covers the upper surface of the cap portion 401, and the fastening plate 400 and the fastening member 403 fix the cap portion 401 and the accommodation portion 402 to be sandwiched therebetween. Furthermore, in the third embodiment, the cap portion 401 constitutes a chamber body of the present disclosure, and the cap portion 401 is configured to be elevated and lowered by an elevating mechanism (not shown). Then, when configuring the cleaning chamber 300, the chamber body is lowered with respect to the accommodation portion 402 by the elevating mechanism. In addition, a gate 404, which can be opened and closed in order to load and unload the wafers W into and from the cleaning chamber 300, is provided in the cleaning chamber 300.

The cleaning chamber 300 has a substantially rectangular parallelepiped shape, and has a first sidewall 411, a second sidewall 412, a third sidewall 413, and a fourth sidewall 414. The first sidewall 411 and the third sidewall 413 face each other, and the second sidewall 412 and the fourth sidewall 414 face each other.

The water vapor supply line 327 is connected to the first sidewall 411, and supply ports 421 for the water vapor, the first nitrogen gas and the second nitrogen gas from the water vapor supply line 327 are formed thereon. As will be described later, an accommodation space 430 is divided into an upper accommodation space 430A and a lower accommodation space 430B, and the supply ports 421 are formed in a total of two places in the upper accommodation space 430A and the lower accommodation space 430B. In addition, the first exhaust line 361 and the second exhaust line 362 are connected to the first sidewall 411, and exhaust ports 422 for exhausting the interior of the cleaning chamber 100 are formed thereon. The exhaust ports 422 are also formed in a total of two places in the upper accommodation space 430A and the lower accommodation space 430B. The exhaust ports 422 may also be formed on the second sidewall 412. Furthermore, the area of the exhaust ports 422 is larger than the area of the supply ports 421. A loading/unloading port 423 for the wafers W is formed on the third sidewall 413. The gate 404 described above is installed on the third sidewall 413.

Figure 14:
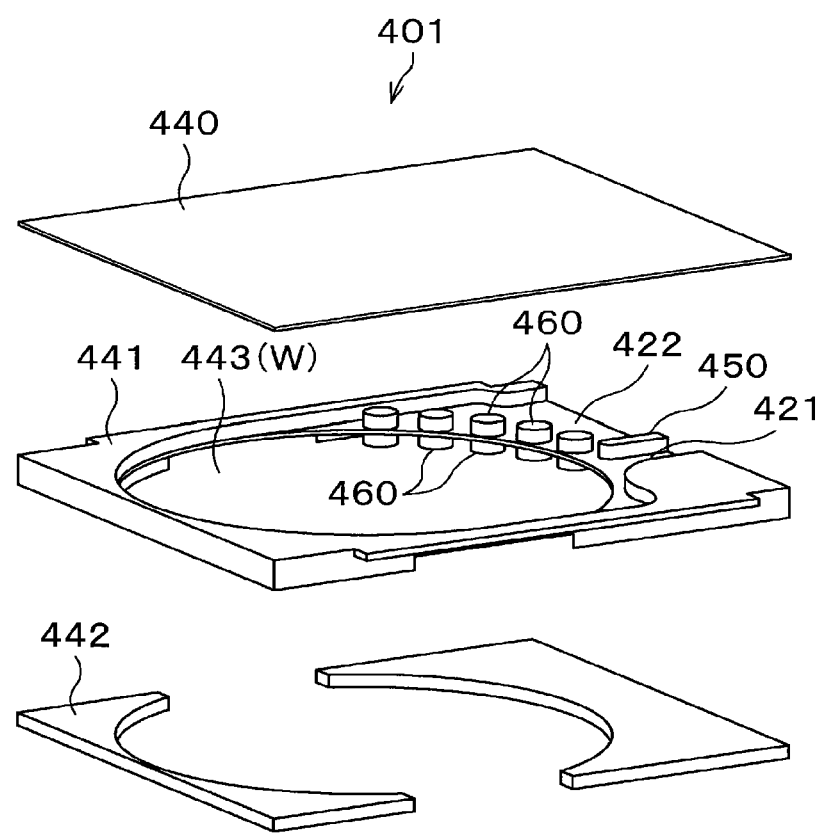
FIG. 14 is an explanatory view illustrating an outline of a configuration of a cap portion according to the third embodiment.

The accommodation space 430 for accommodating two wafers W is formed inside the accommodation portion 402. The accommodation space 430 is formed inside the accommodation portion 402 by fitting the cap portion 401 into the accommodation portion 402. In addition, a support member 431 for supporting the two wafers W is provided inside the accommodation portion 402. The interval between the two wafers W is, for example, 10 mm FIG. 14 is an explanatory view illustrating an outline of a configuration of the cap portion 401. The cap portion 401 is configured by stacking a ceiling plate 440, a partition plate 441, and a bottom plate 442 sequentially from top to bottom. An opening 443, which is opened in a substantially circular shape in plan view, is formed in the partition plate 441. Furthermore, the bottom plate 442 is divided along the opening 443 of the partition plate 441. An upper wafer W, out of the two wafers W accommodated in the cleaning chamber 300, is arranged in the opening 443. Then, the accommodation space 430 is divided into the upper accommodation space 430A and the lower accommodation space 430B by the partition plate 441 and the upper wafer W.

In the partition plate 441, a protrusion 450 protruding from the partition plate 441 is provided on the first sidewall 411 side of the opening 443. The supply port 421 and the exhaust port 422 described above are formed by the protrusions 450. Furthermore, the protrusions 450 are provided on both the upper surface and the lower surface of the partition plate 441.

In the partition plate 441, a plurality of pillars 460 protruding from the partition plate 441 are provided on the first sidewall 411 side of the opening 443 and on the exhaust port 422 side. The plurality of pillars 460 are arranged at desired intervals along the outer periphery of the opening 443 (the wafers W) in plan view. Furthermore, the plurality of pillars 460 are formed on both the upper surface and the lower surface of the partition plate 441. Each pillar 460 has, for example, a cylindrical shape.

Figure 15:
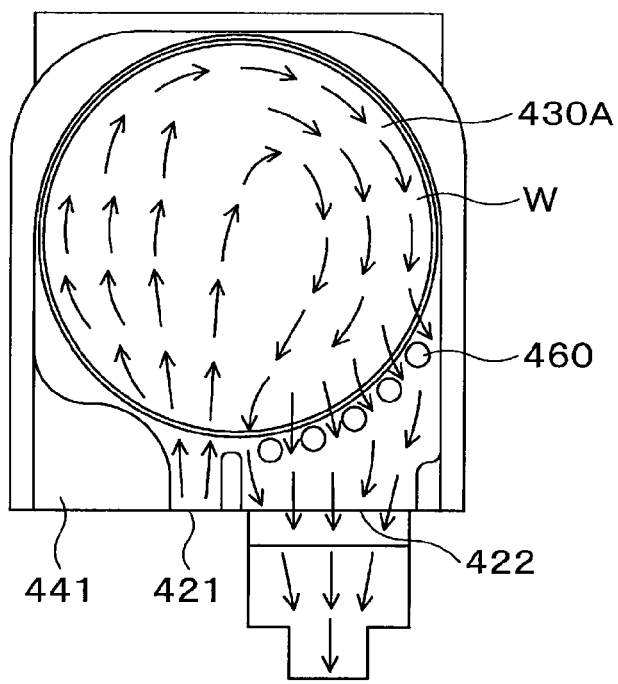
FIG. 15 is an explanatory view illustrating a flow path of a gas supplied from a supply port in an upper accommodation space of the cleaning chamber according to the third embodiment.
Figure 16:
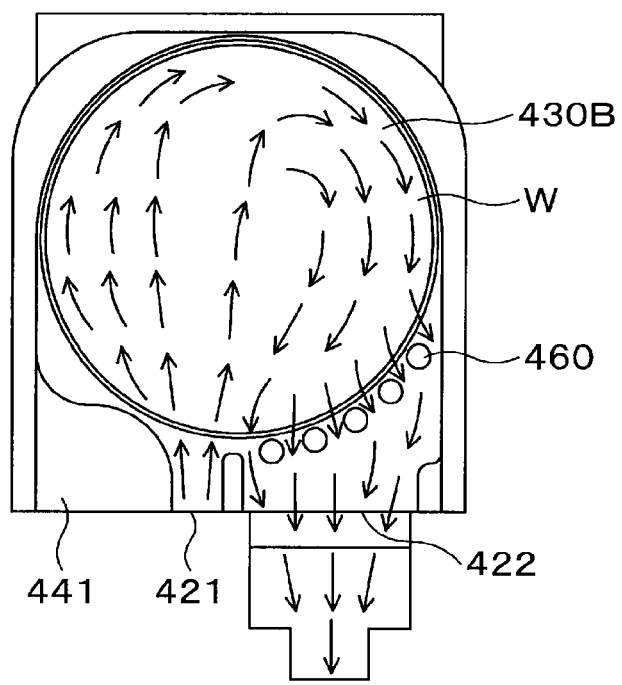
FIG. 16 is an explanatory view illustrating a flow path of a gas supplied from the supply port in a lower accommodation space of the cleaning chamber according to the third embodiment.

FIG. 15 is an explanatory view illustrating a flow path of a gas supplied from the supply port 421 in the upper accommodation space 430A of the cleaning chamber 300. FIG. 16 is an explanatory view illustrating a flow path of a gas supplied from the supply port 421 in the lower accommodation space 430B of the cleaning chamber 300. Furthermore, in the illustrated example, the flow of the water vapor is indicated by arrows, but the same applies to the flow of the first nitrogen gas or the second nitrogen gas.

The water vapor supplied from the supply port 421 flows toward the exhaust port 422 through the surface (upper surface) of the wafers W. At this time, the water vapor flows in a substantially arc shape along the inner side surface of the cleaning chamber 100 (the side surface of the upper accommodation space 430A and the side surface of the lower accommodation space 430B). Furthermore, the flow paths of the gas in the upper accommodation space 430A and the lower accommodation space 430B are substantially identical. Then, the entire surface of the two wafers W is uniformly exposed to the water vapor.

Figure 17:
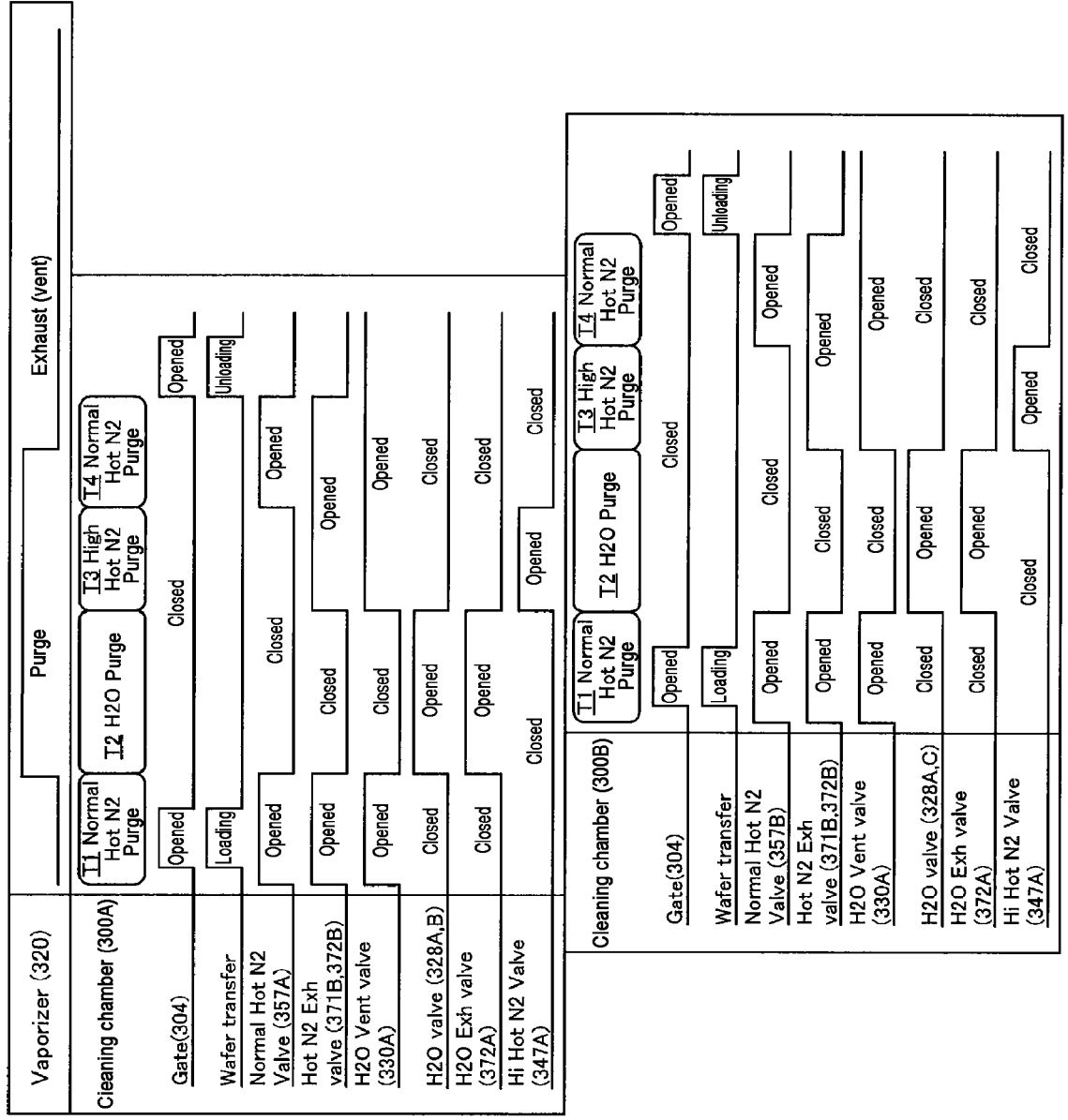
FIG. 17 is an explanatory view illustrating an operation of the wafer cleaning module in a wafer cleaning process according to the third embodiment.

The wafer cleaning module 33 of the third embodiment is configured as described above. Next, the cleaning process of the wafers W in the wafer cleaning module 33 will be described. FIG. 17 is an explanatory view illustrating an operation of the wafer cleaning module 33 in the cleaning process of the wafers W. Furthermore, in the following description using FIG. 17, the cleaning process in the cleaning chambers 300A and 300B will be described, but the cleaning process in the other cleaning chambers 300C and 300D is also similar.

First, the cleaning process in the cleaning chamber 300A will be described. In the cleaning chamber 300A, a first nitrogen gas supply process T1 (normal hot $N_2$ purge), a water vapor supply process T2 ($H_2O$ purge), a second nitrogen gas supply process T3 (high hot $N_2$ purge), and a first nitrogen gas supply process T4 (normal hot $N_2$ purge) are sequentially performed.

[First Nitrogen Gas Supply Process T1 (Normal Hot $N_2$ Purge)]

At this process T1, the valve 357A is opened to supply a first nitrogen gas heated to a first temperature, for example, 50 to 100 degrees C., by the first heating part 350 to the cleaning chamber 300A. Furthermore, the valve 363B is opened and the gas in the cleaning chamber 300A (mainly the first nitrogen gas) is discharged through the first exhaust line 361. That is, in the cleaning chamber 300A, the internal gas is discharged while the first nitrogen gas is supplied under an atmospheric pressure. In addition, at this process T1, the valve 330A is opened and the gas in the collective line 327A is discharged from the vent line 329A.

While the first nitrogen gas is supplied to the cleaning chamber 300A in this way, the gate 404 of the cleaning chamber 300A is opened and two wafers W are loaded thereinto. Then, each wafer W is adjusted to a desired temperature by the first nitrogen gas. The desired temperature is a temperature of, for example, 50 to 80 degrees C., at which fluorine on the wafer W can be removed.

[Water Vapor Supply Process T2 ($H_2O$ Purge)]

At this process T2, the valves 328A and 328B are opened to supply water vapor generated by the vaporizer 320 to the cleaning chamber 300A. Furthermore, the valves 363A and 364A are opened and the gas (mainly the water vapor) in the cleaning chamber 300A is discharged through the second exhaust line 362. That is, in the cleaning chamber 300A, the internal gas is discharged while the water vapor is supplied under an atmospheric pressure.

At this process T2, by exposing the surface of the wafer W to the water vapor, the water vapor reacts with fluorine to remove the fluorine. Furthermore, at this time, since the pillars 460 are formed in the cleaning chamber 300A, the water vapor flows in a substantially arc shape in the upper accommodation space 430A and the lower accommodation space 430B, as illustrated in FIGS. 15 and 16. By doing so, since the entire surfaces of the two wafers W are uniformly exposed to the water vapor, the reaction between the water vapor and the fluorine is promoted, thereby appropriately removing the fluorine.

[Second Nitrogen Gas Supply Process T3 (High Hot Na Purge)]

At this process T3, the valve 347A is opened to supply a second nitrogen gas heated to a second temperature, for example, 120 to 300 degrees C., more preferably 200 to 300 degrees C., by the second heating part 340 to the cleaning chamber 300A. Furthermore, the valve 364B is opened and the gas in the cleaning chamber 300A (mainly the second nitrogen gas) is discharged through the second exhaust line 362. That is, in the cleaning chamber 300A, the internal gas is discharged while the second nitrogen gas is supplied under an atmospheric pressure. In addition, at this process T3, the valve 330A is opened and the gas inside the collective line 327A is discharged from the vent line 329A.

The wafers W exposed to the water vapor at the previous process T2 can be dried by the second nitrogen gas at a high temperature. Furthermore, the water vapor remaining in the cleaning chamber 300A is removed, the water vapor remaining in a portion of the collective line 327A of the water vapor supply line 327 and in the branch line 327B is also removed, and hence the water vapor remaining in the second exhaust line 362 is removed. Dew condensation is suppressed by removing the water vapor from the cleaning chamber 300A, the water vapor supply line 327, and the second exhaust line 362 in this way.

[First Nitrogen Gas Supply Process T4 (Normal Hot $N_2$ Purge)]

At this process T4, the valve 357A is opened to supply the first nitrogen gas heated to the first temperature, for example, 50 to 100 degrees C., by the first heating part 350 to the cleaning chamber 300A. Furthermore, the valve 363B is opened and the gas in the cleaning chamber 300A (mainly the first nitrogen gas) is discharged through the first exhaust line 361. That is, in the cleaning chamber 300A, the internal gas is discharged while the first nitrogen gas is supplied under an atmospheric pressure. In addition, at this process T4, the valve 330A is opened and the gas inside the collective line 327A is discharged from the vent line 329A.

The wafers W are adjusted to a desired temperature by the first nitrogen gas. The desired temperature of the wafers W is a temperature of, for example, 80 degrees C. or lower, at which the wafer transfer mechanism 40 can transfer the wafers W.

When the series of processes T1 to T4 in the cleaning chamber 300A described above is completed, the gate 404 of the cleaning chamber 300A is opened and the two wafers W are unloaded therefrom.

Similar to the cleaning chamber 300A, in the cleaning chamber 300B, the first nitrogen gas supply process T1 (normal hot $N_2$ purge), the water vapor supply process T2 ($H_2O$ purge), the second nitrogen gas supply process T3 (high hot $N_2$ purge), and the first nitrogen gas supply process T4 (normal hot $N_2$ purge) are sequentially performed.

However, in the cleaning chamber 300B, the timings of performing the respective processes T1 to T4 are different. This is because the vaporizer 320, the second heating part 340 and the pressurizing tank 341, and the first heating part 35 and the tank 351 are respectively installed in common in the respective cleaning chambers 300A to 300D. In the cleaning chamber 300B, the water vapor supply process T2 of the cleaning chamber 300B starts after the water vapor supply process T2 of the cleaning chamber 300A is completed.

According to the third embodiment, the same effects as those of the first and second embodiments can be achieved. Moreover, since the two wafers W can be simultaneously processed in one cleaning chamber 300, it is possible to improve the throughput of the whole wafer processing, and to increase the number of processed wafers in the wafer cleaning module 33.

Fourth Embodiment

Figure 18:
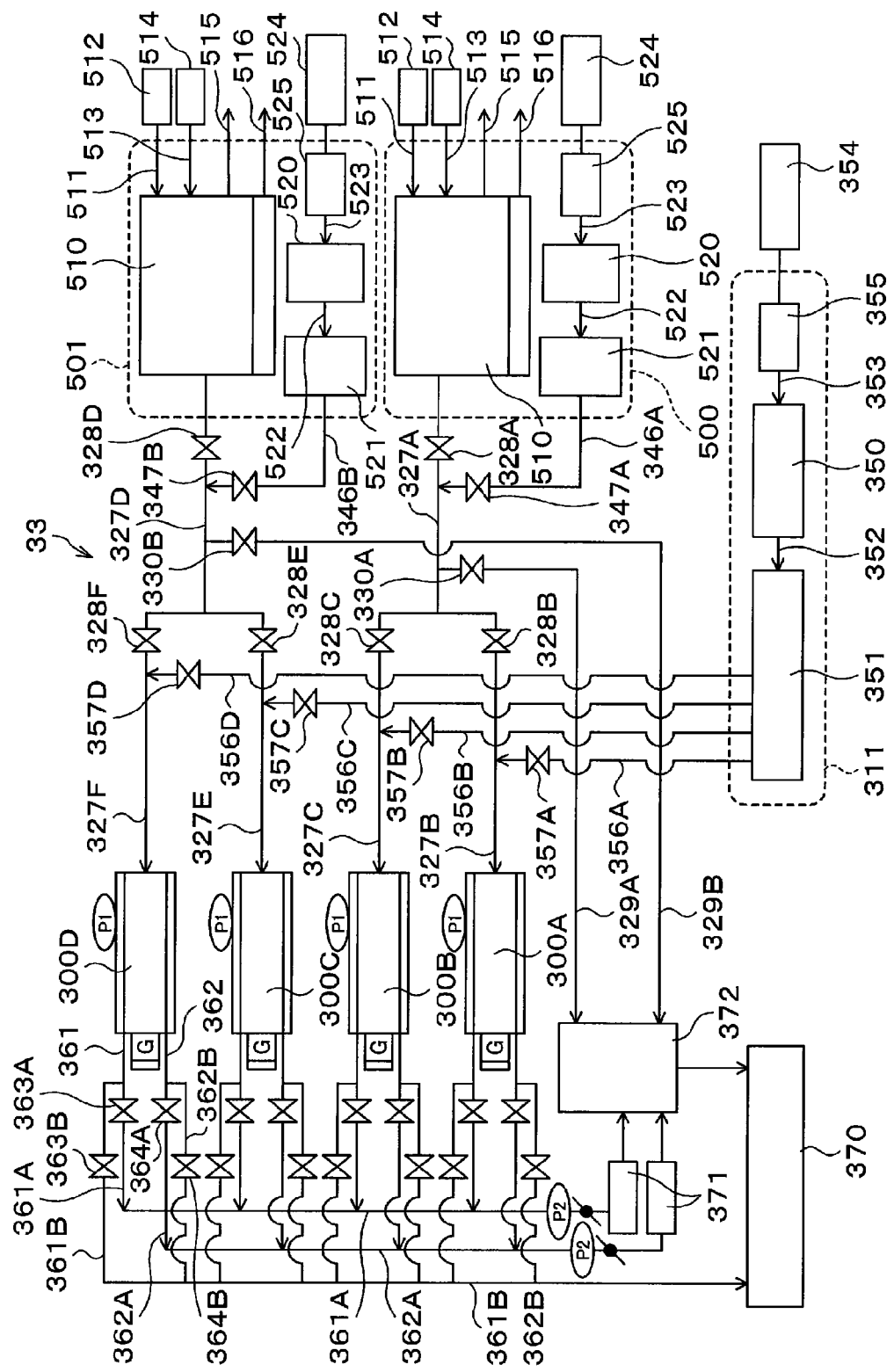
FIG. 18 is an explanatory view illustrating an outline of a configuration of a wafer cleaning module according to a fourth embodiment of the present disclosure.

Next, a configuration of a wafer cleaning module 33 according to a fourth embodiment of the present disclosure will be described. FIG. 18 is an explanatory view illustrating an outline of the configuration of the wafer cleaning module 33.

In the third embodiment, one vaporizer 320, one second heating part 340, and one pressurizing tank 341 are provided, but a plurality of them may be installed. The wafer cleaning module 33 of the fourth embodiment has two vaporizers, two second heating parts, and two pressurizing tanks. That is, the wafer cleaning module 33 of the fourth embodiment has two air supply modules 500 and 501, instead of the air supply module 310 of the first embodiment. Other components of the wafer cleaning module 33 of the fourth embodiment are similar to the components of the wafer cleaning module 33 of the third embodiment.

The air supply module 500 supplies water vapor and a second nitrogen gas to the cleaning chambers 300A and 300B. The air supply module 500 has a vaporizer 510. The collective line 327A is connected to the vaporizer 510. The configuration of the vaporizer 510 is similar to that of the vaporizer 320 in the third embodiment, but the capacity thereof is smaller. In addition, a pure water supply source 512 is connected to the vaporizer 510 via a supply line 511, and a nitrogen gas supply source 514 is connected thereto via a supply line 513. Furthermore, a vent line 515 is connected to the vaporizer 510, and a drain 516 is connected thereto.

The air supply module 500 further has a second heating part 520 and a pressurizing tank 521 for storing the second nitrogen gas at a desired pressure. The second heating part 520 and the pressurizing tank 521 are connected via a supply line 522, and the second heating part 520 is installed at the upstream side of the pressurizing tank 521. The configurations of the second heating part 520 and the pressurizing tank 521 are similar to the configurations of the second heating part 340 and the pressurizing tank 341 in the third embodiment, respectively. In addition, a nitrogen gas supply source 524 is connected to the second heating part 520 via a supply line 523, and a flow meter 525 is installed in the supply line 523. A second nitrogen gas supply line 346A is connected to the pressurizing tank 521.

The configuration of the air supply module 501 is similar to the configuration of the air supply module 500. However, in the air supply module 410, the collective line 327D is connected to the vaporizer 510, and the second nitrogen gas supply line 346B is connected to the pressurizing tank 521.

According to the fourth embodiment, the same effects as those of the third embodiment can be achieved. Moreover, since two vaporizers 510, two second heating parts 520, and two pressurizing tanks 521 are installed, a detailed and delicate cleaning process is possible.

The following configurations also belong to the technical scope of the present disclosure.

(1) A substrate cleaning apparatus, includes: a vaporizer configured to generate water vapor; a first heating part configured to heat a nitrogen gas to a first temperature; a second heating part configured to heat the nitrogen gas to a second temperature, wherein the second temperature is higher than the first temperature; and at least one cleaning chamber connected to the vaporizer, the first heating part, and the second heating part, wherein the at least one cleaning chamber is configured so that at least one substrate is exposed to the water vapor, the nitrogen gas having the first temperature, or the nitrogen gas having the second temperature under an atmospheric pressure. According to (1), since the substrate is adjusted to a desired temperature by the nitrogen gas having the first temperature, it is possible to appropriately remove fluorine on the surface of the substrate by the water vapor. Furthermore, it is possible to remove the water vapor on the surface of the substrate by the nitrogen gas having the second temperature of high temperature. Thus, it is possible to appropriately perform a substrate cleaning process after the COR process and the PHT process are performed.

(2) In the apparatus of (1), the first temperature is 50 to 100 degrees C., and the second temperature is 120 to 300 degrees C. According to the first temperature and the second temperature of (2), it is possible to appropriately achieve the effect by (1).

(3) The apparatus of (2) further includes: at least one controller configured to control the substrate cleaning apparatus so as to supply the water vapor to the at least one cleaning chamber and then supply the nitrogen gas having the second temperature to the at least one cleaning chamber; and a pressure regulation part connected to the second heating part and configured to adjust the nitrogen gas to a desired pressure, wherein the second heating part or the pressure regulation part is connected to a water vapor supply line connecting the vaporizer and the at least one cleaning chamber and configured to remove the water vapor remaining in a portion of the water vapor supply line and in the cleaning chamber by supplying the nitrogen gas having the second temperature and the desired pressure to the at least one cleaning chamber through the portion of the water vapor supply line.

(4) In the apparatus of (3), the pressure regulation part is a pressurizing tank configured to store the nitrogen gas having the second temperature at the desired pressure. According to (3) or (4), the nitrogen gas having the second temperature adjusted to the desired pressure by the pressure adjustment part (pressurizing tank) can be supplied to the cleaning chamber instantaneously and at a high pressure.

(5) In the apparatus of (4), the at least one cleaning chamber is a plurality of cleaning chambers, and the plurality of cleaning chambers are configured to share the vaporizer, the first heating part, and the second heating part.

(6) The apparatus of (5) further includes a first exhaust line and a second exhaust line connected to the plurality of cleaning chambers. (7) In the apparatus of (6), the first exhaust line is used to supply the nitrogen gas having the first temperature into the cleaning chambers and then discharge the gas in the cleaning chambers, and the second exhaust line is used to supply the water vapor into the cleaning chambers and then discharge the gas in the cleaning chambers and used to supply the nitrogen gas having the second temperature into the cleaning chambers and then discharge the gas in the cleaning chambers. According to any one of (6) and (7), the internal gas of the cleaning chamber can be appropriately discharged without interference.

(8) In the apparatus of (7), the cleaning chamber has a first sidewall and a second sidewall, and the first sidewall has a supply port for the water vapor, the nitrogen gas having the first temperature and the nitrogen gas having the second temperature, and the second sidewall has an exhaust port.

(9) In the apparatus of (8), the cleaning chamber has a fin arranged to cover the substrate in plan view by accommodating and cleaning one substrate, wherein the fin is configured to form a flow path of a gas having an U shape along an inner side surface of the cleaning chamber and an outer side surface of the fin from the supply port to the exhaust port. (10) In the apparatus of (9), the cleaning chamber has a third sidewall different from the first sidewall and the second sidewall, and the third sidewall has a loading/unloading port for the substrate. (11) In the apparatus of (8), the cleaning chamber has pillars configured to accommodate and clean one or two substrates and arranged outside the substrates in plan view, wherein the pillars are configured to form a flow path of a gas having an arc shape along on the inner side surface of the cleaning chamber from the supply port to the exhaust port. According to (9) or (11), it is possible to allow the water vapor, the first nitrogen gas, and the second nitrogen gas to appropriately flow in the cleaning chamber. As a result, the entire surface of the substrate is uniformly exposed to the water vapor, and thus, it is possible to appropriately remove the fluorine. In addition, the entire surface of the substrate can be exposed to the second nitrogen gas, thereby appropriately drying the substrate.

(12) In the apparatus of (11), the cleaning chamber has: a chamber body configured to cover the one or two substrates; and an elevating mechanism configured to elevate and lower the chamber body. (13) In the apparatus of (8), the cleaning chamber has a third sidewall different from the first sidewall and the second sidewall, and the third sidewall has a loading/unloading port for the substrate. (14) In the apparatus of (6), the first exhaust line is used to supply the nitrogen gas having the first temperature into the cleaning chambers and then discharge the gas in the cleaning chambers and used to supply the nitrogen gas having the second temperature into the cleaning chambers and then discharge the gas in the cleaning chambers, and the second exhaust line is used to supply the water vapor into the cleaning chambers and then discharge the gas in the cleaning chambers. (15) The apparatus of (1) further includes: at least one controller configured to control the substrate cleaning apparatus so as to supply the water vapor to the at least one cleaning chamber and then supply the nitrogen gas having the second temperature to the at least one cleaning chamber; and a pressure regulation part connected to the second heating part and configured to adjust the nitrogen gas to a desired pressure, wherein the second heating part or the pressure regulation part is connected to a water vapor supply line connecting the vaporizer and the at least one cleaning chamber and configured to remove the water vapor remaining in a portion of the water vapor supply line and in the cleaning chamber by supplying the nitrogen gas having the second temperature and the desired pressure to the at least one cleaning chamber through the portion of the water vapor supply line. (16) In the apparatus of (1), the at least one cleaning chamber is a plurality of cleaning chambers, and the plurality of cleaning chambers are configured to share the vaporizer, the first heating part, and the second heating part. (17) In the apparatus of (1), the cleaning chamber has a first sidewall and a second sidewall, and the first sidewall has a supply port for the water vapor, the nitrogen gas having the first temperature and the nitrogen gas having the second temperature, and the second sidewall has an exhaust port.

(18) A substrate cleaning method, includes: a) arranging at least one substrate in a cleaning chamber; b) supplying a nitrogen gas having a first temperature to the cleaning chamber under an atmospheric pressure; c) supplying water vapor to the cleaning chamber under an atmospheric pressure; and d) supplying a nitrogen gas having a second temperature to the cleaning chamber under an atmospheric pressure, wherein the second temperature is higher than the first temperature. (19) The method of (18) further includes supplying the nitrogen gas having the first temperature to the cleaning chamber under an atmospheric pressure after (d). (20) The method of (18) further includes discharging the gas in the cleaning chamber from a first exhaust line in b), discharging the gas in the cleaning chamber from a second exhaust line in c) and d), and discharging the gas in the cleaning chamber from the first exhaust line or the second exhaust line after d).

According to the present disclosure in some embodiments, it is possible to appropriately remove a gas component remaining on a substrate after processing the substrate with a processing gas.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate cleaning apparatus, comprising:
a vaporizer configured to generate water vapor;
a first heater configured to heat a nitrogen gas to a first temperature;
a second heater configured to heat the nitrogen gas to a second temperature, wherein the second temperature is higher than the first temperature;
a plurality of cleaning chambers connected to the vaporizer, the first heater, and the second heater, wherein the plurality of cleaning chambers comprises a first cleaning chamber;
at least one controller configured to control the substrate cleaning apparatus so as to supply the water vapor to the first cleaning chamber and then supply the nitrogen gas having the second temperature to the first cleaning chamber;
a pressure regulator connected to the second heater and configured to adjust the nitrogen gas to a target pressure; and
a first exhaust line and a second exhaust line connected to the plurality of cleaning chambers;
wherein the first cleaning chamber is configured so that at least one substrate is exposed to the water vapor, the nitrogen gas having the first temperature, or the nitrogen gas having the second temperature under an atmospheric pressure,
wherein the first temperature is 50 to 100 degrees C., and the second temperature is 120 to 300 degrees C.,
wherein the second heater or the pressure regulator is connected to a water vapor supply line connecting the vaporizer and the first cleaning chamber and configured to remove water vapor remaining in a portion of the water vapor supply line and in the first cleaning chamber by supplying the nitrogen gas having the second temperature and the target pressure to the first cleaning chamber through the portion of the water vapor supply line,
wherein the pressure regulator is a pressurizing tank configured to store the nitrogen gas having the second temperature at the target pressure,
wherein the plurality of cleaning chambers are configured to share the vaporizer, the first heat, and the second heater,
wherein the first exhaust line is used to supply the nitrogen gas having the first temperature into the plurality of cleaning chambers and then discharge a gas in the plurality of cleaning chambers, and the second exhaust line is used to supply the water vapor into the plurality of cleaning chambers and then discharge a gas in the plurality of cleaning chambers and used to supply the nitrogen gas having the second temperature into the plurality of cleaning chambers and then discharge a gas in the plurality of cleaning chambers,
wherein the first cleaning chamber has a first sidewall and a second sidewall,
wherein the first sidewall has a supply port for the water vapor, the nitrogen gas having the first temperature, and the nitrogen gas having the second temperature, and the second sidewall has an exhaust port, and
wherein the first cleaning chamber accommodates and cleans a first substrate and has a fin arranged to cover the first substrate in a plan view, wherein the fin is configured to form a U-shaped flow path of a gas along an inner side surface of the first cleaning chamber and an outer side surface of the fin from the supply port to the exhaust port.

2. The apparatus of claim 1, wherein the first cleaning chamber has a third sidewall different from the first sidewall and the second sidewall, and
wherein the third sidewall has a loading/unloading port for the first substrate.

* * * * *